(12) United States Patent
Ko et al.

(10) Patent No.: US 12,132,140 B2
(45) Date of Patent: Oct. 29, 2024

(54) INK CONTAINING LIGHT-EMITTING ELEMENTS AND METHOD OF FABRICATING DISPLAY DEVICE USING THE SAME

(71) Applicant: Samsung Display Co., LTD., Yongin-si (KR)

(72) Inventors: Hyo Jin Ko, Seoul (KR); Duk Ki Kim, Suwon-si (KR); Yong Hwi Kim, Asan-si (KR); Jun Bo Sim, Suwon-si (KR); Na Mi Hong, Cheonan-si (KR); Jong Hyuk Kang, Suwon-si (KR); Gyu Bong Kim, Suwon-si (KR); Hoi Lim Kim, Seoul (KR); Sae Na Yun, Suwon-si (KR); Chang Hee Lee, Seoul (KR); Hyun Deok Im, Seoul (KR); Eun A Cho, Suwon-si (KR); Jae Kook Ha, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 430 days.

(21) Appl. No.: 17/476,993

(22) Filed: Sep. 16, 2021

(65) Prior Publication Data

US 2022/0093817 A1 Mar. 24, 2022

(30) Foreign Application Priority Data

Sep. 22, 2020 (KR) .................. 10-2020-0121910

(51) Int. Cl.
*H01L 33/00* (2010.01)
*B82B 3/00* (2006.01)
(Continued)

(52) U.S. Cl.
CPC .......... *H01L 33/005* (2013.01); *B82B 3/0052* (2013.01); *C09D 11/033* (2013.01);
(Continued)

(58) Field of Classification Search
CPC ..... H01L 33/005; H01L 27/156; H01L 33/24; H01L 33/38; H01L 33/44; B82B 3/0052; C09D 11/033; C09D 11/50; C09D 11/52
See application file for complete search history.

(56) References Cited

U.S. PATENT DOCUMENTS

2007/0015675 A1* 1/2007 Painter .................. C11D 3/43
510/276
2010/0155786 A1* 6/2010 Heald ............... H01L 29/42332
438/758
(Continued)

FOREIGN PATENT DOCUMENTS

CN 102369249 3/2012
CN 105431910 3/2016
(Continued)

OTHER PUBLICATIONS

Yun Jae Eo et al., "Enhanced DC-operated electroluminescence of forwardly aligned p/MQW/n InGaN nanorod LEDs via DC offset-AC dielectrophoresis", ACS Applied Materials & Interfaces, Oct. 11, 2017, pp. 1-33, vol. 9, 37912-37920.
(Continued)

*Primary Examiner* — Victor A Mandala
*Assistant Examiner* — Colleen E Snow
(74) *Attorney, Agent, or Firm* — KILE PARK REED & HOUTTEMAN PLLC

(57) ABSTRACT

An ink includes a solvent, and light-emitting elements dispersed in the solvent, each of the light-emitting elements comprising semiconductor layers and an insulating film partially surrounding outer surfaces of the semiconductor layers, wherein the solvent has Hansen solubility parameters of a polarity parameter between about 4 and about 9 and a hydrogen bonding parameter between about 6 and about 11.

19 Claims, 21 Drawing Sheets
(2 of 21 Drawing Sheet(s) Filed in Color)

(51) Int. Cl.
  *C09D 11/033*  (2014.01)
  *C09D 11/50*   (2014.01)
  *C09D 11/52*   (2014.01)
  *H01L 27/15*   (2006.01)
  *H01L 33/24*   (2010.01)
  *H01L 33/38*   (2010.01)
  *H01L 33/44*   (2010.01)

(52) U.S. Cl.
  CPC ............. *C09D 11/50* (2013.01); *C09D 11/52* (2013.01); *H01L 27/156* (2013.01); *H01L 33/24* (2013.01); *H01L 33/38* (2013.01); *H01L 33/44* (2013.01); *H01L 2933/0016* (2013.01)

(56) References Cited

U.S. PATENT DOCUMENTS

| | | | |
|---|---|---|---|
| 2021/0036253 A1* | 2/2021 | Asaoka | ............... H10K 50/115 |
| 2021/0238435 A1 | 8/2021 | Sim et al. | |
| 2021/0269662 A1 | 9/2021 | Sim et al. | |
| 2021/0332256 A1 | 10/2021 | Sim et al. | |
| 2021/0398956 A1 | 12/2021 | Jung et al. | |
| 2022/0013693 A1 | 1/2022 | Cho et al. | |
| 2022/0080725 A1* | 3/2022 | Lee | ..................... B41J 2/04558 |
| 2023/0357610 A1* | 11/2023 | Seibel | .................... C09J 133/06 |

FOREIGN PATENT DOCUMENTS

| | | |
|---|---|---|
| CN | 110475828 | 11/2019 |
| JP | 2019-214659 | 12/2019 |
| JP | 2020-9797 | 1/2020 |
| KR | 10-1770632 | 8/2017 |
| KR | 10-2020-0050000 | 5/2020 |
| KR | 10-2020-0088948 | 7/2020 |
| KR | 10-2021-0098589 | 8/2021 |
| KR | 10-2021-0109079 | 9/2021 |
| KR | 10-2021-0130889 | 11/2021 |
| WO | 2014/174053 | 10/2014 |
| WO | 2017/221802 | 12/2017 |
| WO | 2020/091171 | 5/2020 |
| WO | 2020/091174 | 5/2020 |
| WO | 2020/149513 | 7/2020 |

OTHER PUBLICATIONS

Extended European search report for European Patent Application or Patent No. 21193628.1 dated Feb. 18, 2022.

* cited by examiner

INK CONTAINING LIGHT-EMITTING ELEMENTS AND METHOD OF FABRICATING DISPLAY DEVICE USING THE SAME

CROSS-REFERENCE TO RELATED APPLICATION(S)

This application claims priority to and the benefit of Korean Patent Application No. 10-2020-0121910 under 35 U.S.C. § 119, filed on Sep. 22, 2020, in the Korean Intellectual Property Office (KIPO), the disclosure of which is incorporated herein by reference in its entirety.

BACKGROUND

1. Technical Field

The disclosure relates to an ink containing light-emitting elements and a method of fabricating a display device using the same.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices are for displaying images and include a display panel such as an organic light-emitting display panel or a liquid-crystal display panel. Among them, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

SUMMARY

Aspects of the disclosure provide an ink that comprises a solvent capable of dispersing light-emitting elements so that the dispersibility of the light-emitting elements can be improved.

Aspects of the disclosure also provide a method of fabricating a display device that can improve the dispersibility of the light-emitting elements after a printing process using the ink.

It should be noted that objects of the disclosure are not limited to the above-mentioned object; and other objects of the disclosure will be apparent to those skilled in the art from the following descriptions.

According to embodiments of the disclosure, a solvent has Hansen solubility parameters in predetermined ranges and/or a particular functional group, so that the light-emitting elements mixed in the solvent can be more dispersed.

According to the embodiments of the disclosure, it is possible to suppress light-emitting elements in the ink from sticking together in case that they are dropped onto sub-pixels, thereby suppressing poor alignment and achieving uniform luminance in the sub-pixels.

It should be noted that effects of the disclosure are not limited to those described above and other effects of the disclosure will be apparent to those skilled in the art from the following descriptions.

According to an embodiment of the disclosure, an ink may comprise a solvent, and a plurality of light-emitting elements dispersed in the solvent, each of the plurality of light-emitting elements comprising a plurality of semiconductor layers and an insulating film partially surrounding outer surfaces of the plurality of semiconductor layers. The solvent may have Hansen solubility parameters of a polarity parameter between about 4 and about 9 and a hydrogen bonding parameter between about 6 and about 11.

In an embodiment, the solvent may comprise at least one ester group.

In an embodiment, the solvent may comprise a compound represented by Chemical Formula 1 below:

[Chemical Formula 1]

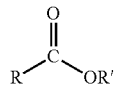

Each of R and R' may be hydrogen, a substituted or unsubstituted linear or branched alkyl group having 1 to 10 carbon atoms, a substituted or unsubstituted alkyl ether group having 1 to 10 carbon atoms, a substituted or unsubstituted alkyl ester group having 1 to 10 carbon atoms, or a substituted or unsubstituted phenyl group.

In an embodiment, a substituent of each of the R and R' may be at least one selected from a group consisting of an alkyl group having 1 to 10 carbon atoms, an ester group, an alkyl ester group having 1 to 10 carbon atoms, an ether group, an alkyl ether group having 1 to 10 carbon atoms, a carbonyl group, and a hydroxy group.

In an embodiment, the solvent may comprise a compound represented by one of Chemical Formulas 2 to 9 below:

[Chemical Formula 2]

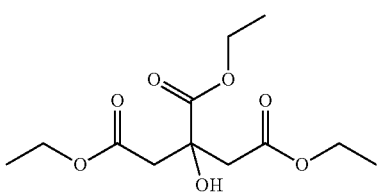

[Chemical Formula 3]

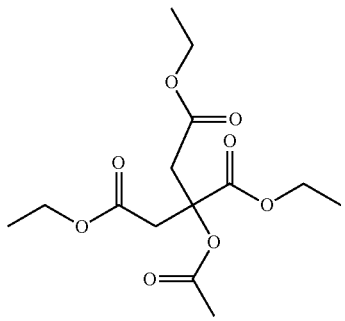

-continued

[Chemical Formula 4]
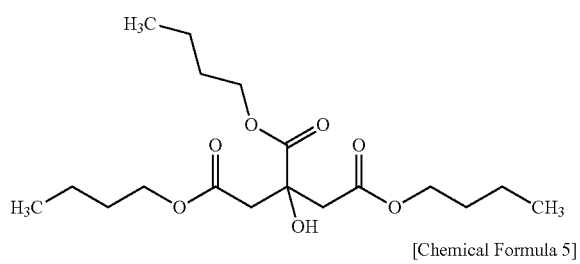

[Chemical Formula 5]
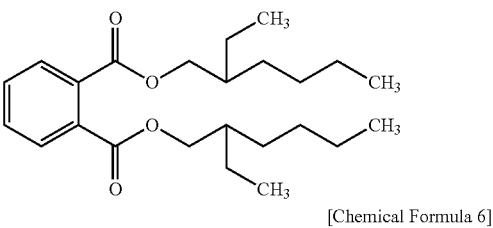

[Chemical Formula 6]
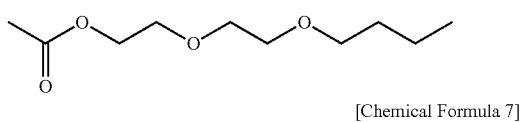

[Chemical Formula 7]

[Chemical Formula 8]
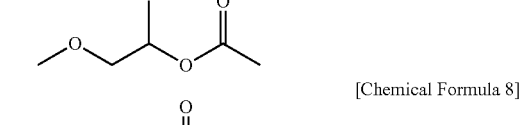

[Chemical Formula 9]
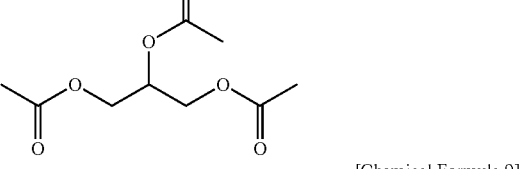

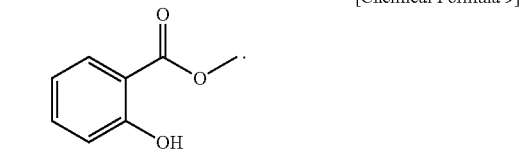

In an embodiment, the solvent may comprise 1 to 4 ester groups.

In an embodiment, the solvent may have a viscosity in a range of about 20 cP to about 200 cP at a room temperature.

In an embodiment, a boiling point of the solvent may be equal to or less than about 400° C.

In an embodiment, a content of the plurality of light-emitting elements may be about 0.01 to about 10 parts by weight based on 100 parts by weight of the ink.

In an embodiment, the plurality of semiconductor layers of each of the plurality of light-emitting elements may comprise a first semiconductor layer, a second semiconductor layer, and a light-emitting layer disposed between the first semiconductor layer and the second semiconductor layer. The insulating film may surround at least an outer surface of the light-emitting layer.

According to an embodiment of the disclosure, the method of fabricating a display device, the method may comprise preparing an ink comprising a solvent and a plurality of light-emitting elements, preparing a target substrate on which a first electrode and a second electrode may be formed, applying the ink onto the target substrate, and generating an electric field over the target substrate to dispose the plurality of light-emitting elements on the first electrode and the second electrode. The solvent may have Hansen solubility parameters of a polarity parameter between about 4 and about 9 and a hydrogen bonding parameter between about 6 and about 11.

In an embodiment, the solvent may comprise at least one ester group.

In an embodiment, the solvent may comprise a compound represented by Chemical Formula 1 below:

[Chemical Formula 1]
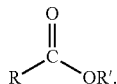

Each of R and R' may be hydrogen, a substituted or unsubstituted linear or branched alkyl group having 1 to 10 carbon atoms, a substituted or unsubstituted alkyl ether group having 1 to 10 carbon atoms, a substituted or unsubstituted alkyl ester group having 1 to 10 carbon atoms, or a substituted or unsubstituted phenyl group.

In an embodiment, a substituent of each of the R and R' may be at least one selected from a group consisting of an alkyl group having 1 to 10 carbon atoms, an ester group, an alkyl ester group having 1 to 10 carbon atoms, an ether group, an alkyl ether group having 1 to 10 carbon atoms, a carbonyl group, and a hydroxy group.

In an embodiment, the solvent may comprise a compound represented by one of Chemical Formulas 2 to 9 below:

[Chemical Formula 2]
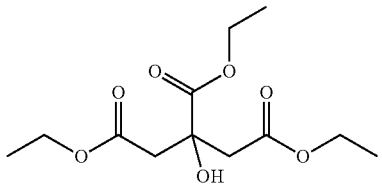

[Chemical Formula 3]
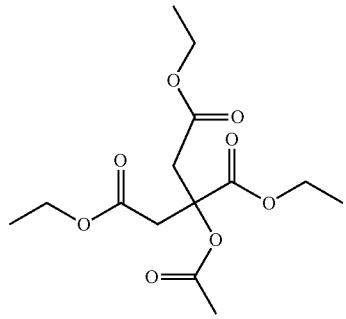

[Chemical Formula 4]
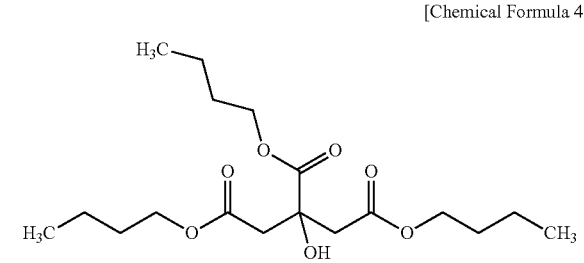

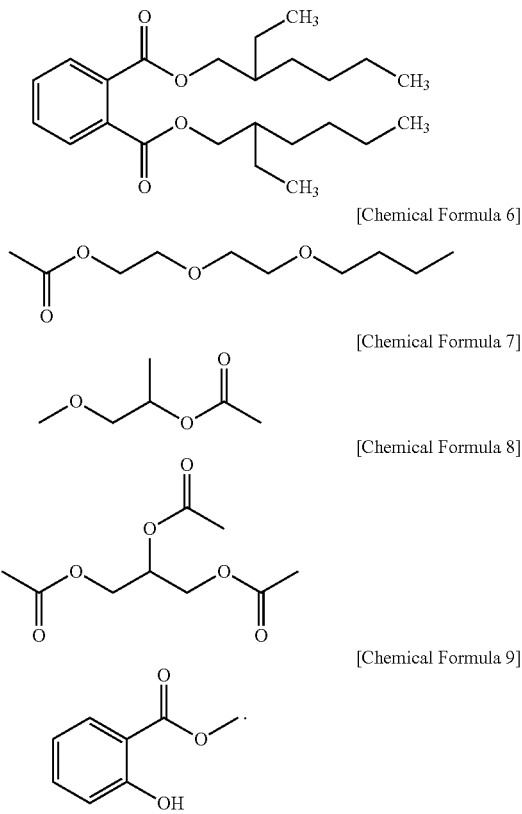

In an embodiment, the solvent may comprise 1 to 4 ester groups.

In an embodiment, the solvent may have a viscosity in a range of about 20 cP to about 200 cP at a room temperature.

In an embodiment, a boiling point of the solvent may be equal to or less than about 400° C.

In an embodiment, the method may further comprise performing a heat treatment to remove the solvent after the generating of the electric field over the target substrate to dispose the plurality of light-emitting elements on the first electrode and the second electrode.

In an embodiment, the heat treatment may be performed at a temperature in range of about 100° C. to about 400° C.

BRIEF DESCRIPTION OF THE DRAWINGS

The patent or application file contains at least one drawing executed in color. Copies of this patent or patent application publication with color drawings will be provided by the Office upon request and payment of the necessary fee.

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which some embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or one or more intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

Figure 1:
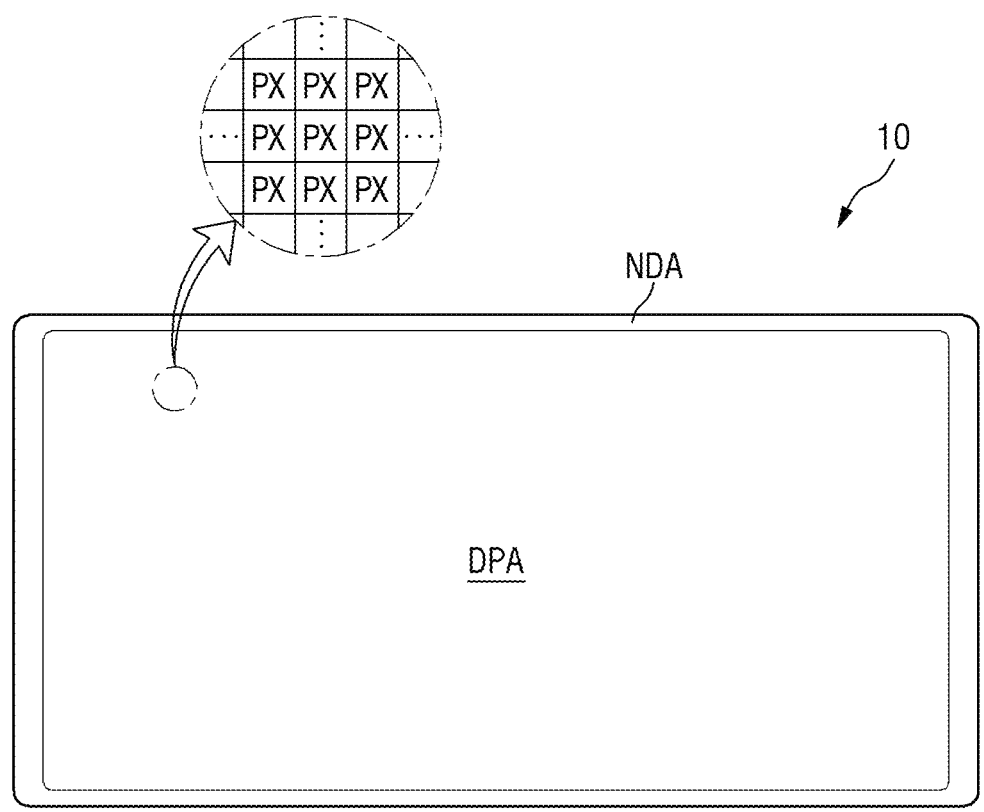
FIG. 1 is a schematic plan view of a display device according to an embodiment of the disclosure.

FIG. 1 is a schematic plan view of a display device according to an embodiment of the disclosure.

Referring to FIG. 1, the display device 10 displays a moving image or a still image. The display device 10 may refer to any electronic device that includes a display screen. For example, the display device 10 may include a television set, a laptop computer, a monitor, an electronic billboard, the Internet of Things devices, a mobile phone, a smart phone, a tablet personal computer (PC), an electronic watch, a smartwatch, a watch phone, a head-mounted display device, a mobile communications terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the disclosure is not limited thereto. Any other display panel may be employed as long as the technical idea of the disclosure can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may be similar to the overall shape of the display device 10. FIG. 1 shows the display device 1 in the shape of a rectangle with longer horizontal sides and the display area DPA.

The display device 10 may include the display area DPA and a non-display area NDA. In the display area DPA, images can be displayed. In the non-display areas NDA, images are not displayed. The display area DPA may be referred to as an active area, while the non-display areas NDA may also be referred to as an inactive area. The display area DPA may occupy generally the center of the display device 10.

The display area DPA may include pixels PX. The pixels PX may be arranged in a matrix. The shape of each pixel PX may be, but is not limited to, a rectangle or a square in a plan view. Each pixel may have a diamond shape having sides inclined with respect to a direction. The pixels PX may be arranged in stripes and PenTile® pattern alternately. Each of the pixels PX may include at least one light-emitting element 30 that emits light of a particular wavelength band to represent a color.

The non-display areas NDA may be disposed around or adjacent to the display area DPA. The non-display areas NDA may surround the display area DPA entirely or partially. The display area DPA may have a rectangular shape, and the non-display areas NDA may be disposed to be adjacent to the four sides of the display area DPA. The non-display area NDA may form the bezel of the display device 10. Lines or circuit drivers included in the display device 10 may be disposed in each of the non-display areas NDA, or external devices may be mounted.

Figure 2:
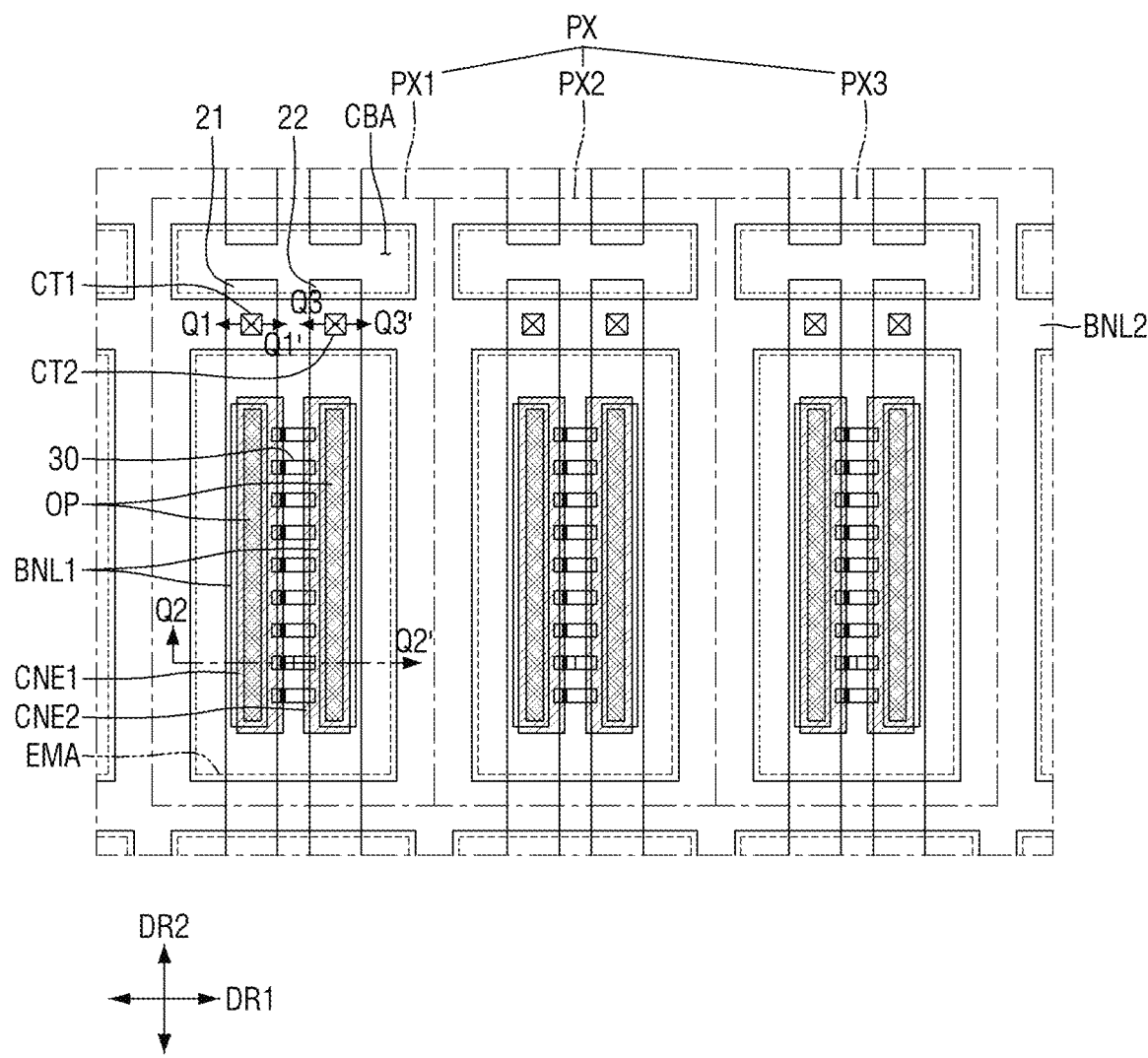
FIG. 2 is a schematic plan view showing a pixel of a display device according to an embodiment of the disclosure.

FIG. 2 is a schematic plan view showing a pixel of a display device according to an embodiment of the disclosure.

Referring to FIG. 2, each of the pixels PX may include sub-pixels PXn, where n is an integer ranging from one to three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. It is, however, to be understood that the disclosure is not limited thereto. All the sub-pixels PXn may emit light of the same color. Although the pixel PX includes three sub-pixels PXn in the example shown in FIG. 2, the disclosure is not limited thereto. The pixel PX may include more than two sub-pixels PXn.

Each of the sub-pixels PXn of the display device 10 may include an emission area (or light emission area) EMA and a non-emission area (not shown). In the emission area EMA, the light-emitting elements 30 may be disposed to emit light of a particular wavelength. In the non-emission area, no light-emitting element 30 is disposed and light emitted from the light-emitting elements 30 do not reach, and no light exits therefrom. The emission area may include an area in which the light-emitting elements 30 are disposed and may include an area adjacent to the light-emitting elements 30 where lights emitted from the light-emitting element 30 exit.

It is, however, to be understood that the disclosure is not limited thereto. The emission area may also include an area in which light emitted from the light-emitting elements 30 is reflected or refracted by other elements to exit. The light-emitting elements 30 may be disposed in each of the sub-pixels PXn, and the emission area may include the area where the light-emitting elements are disposed and the adjacent area.

Each of the sub-pixels PXn may further include a cut area CBA disposed in the non-emission area. The cut area CBA may be disposed on a side of the emission area EMA in the second direction DR2. The cut area CBA may be disposed between the emission areas EMA of neighboring sub-pixels PXn in the second direction DR2. In the display area DPA of the display device 10, emission areas EMA and cut areas CBA may be arranged. For example, the emission areas EMA and the cut areas CBA may be arranged repeatedly in the first direction DR1 and may be arranged alternately in the second direction DR2. The spacing between the cut areas CBA in the first direction DR1 may be smaller than the spacing between the emission areas EMA in the first direction DR1. A second bank BNL2 may be disposed between the cut areas CBA and the emission areas EMA, and the distance between them may vary depending on the width of the second bank BNL2. Although the light-emitting elements 30 are not disposed in the cut areas CBA and no light exits therefrom, parts of the electrodes 21 and 22 disposed in each of the sub-pixels PXn may be disposed there. The electrodes 21 and 22 disposed for each of the sub-pixels PXn may be disposed separately from each other in the cut area CBA.

Figure 3:
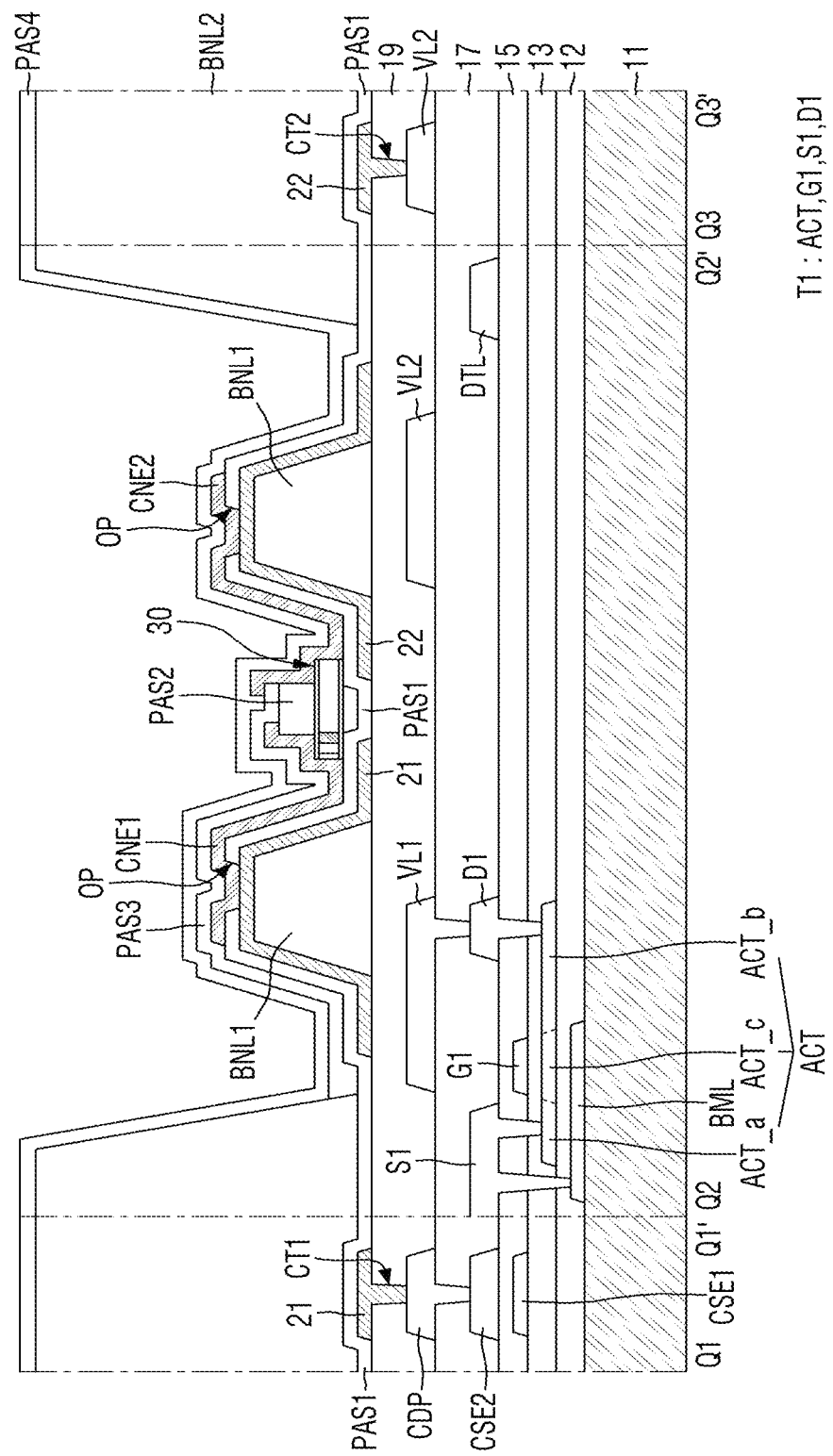
FIG. 3 is a schematic cross-sectional view taken along lines Q1-Q1', Q2-Q2' and Q3-Q3' of FIG. 2.

FIG. 3 is a schematic cross-sectional view taken along lines Q1-Q1', Q2-Q2' and Q3-Q3' of FIG. 2. FIG. 3 illustrates a cross section of the light-emitting element 30 and other elements disposed in the first sub-pixel PX1 of FIG. 2.

Referring to FIG. 3 in conjunction with FIG. 2, the display device 10 may include a first substrate 11, a semiconductor layer disposed on the first substrate 11, conductive layers, and insulating layers. The semiconductor layer, the conductive layers and the insulating layers may form a circuit layer and an emission material layer of the display device 10.

Specifically, the first substrate 11 may be an insulating substrate. The first substrate 11 may be made of an insulating material such as glass, quartz and a polymer resin. The first substrate 11 may be either a rigid substrate or a flexible substrate that can be bent, folded, or rolled.

The light-blocking layer BML may be disposed on the first substrate 11. The light-blocking layer BML may overlap an active layer ACT of a first transistor T1 of the display device 10. The light-blocking layer BML may include a material that blocks light, and thus can prevent light from entering the active layer ACT of the first transistor T1. For example, the light-blocking layer BML may be formed of an opaque metal material that blocks light transmission. It is, however, to be understood that the disclosure is not limited thereto. In some implementations, the light-blocking layer BML may be omitted.

The buffer layer 12 may be disposed entirely on the first substrate 11, including the light-blocking layer BML. The buffer layer 12 may be formed on the first substrate 11 to protect the first thin-film transistors T1 of the pixels PX from moisture permeating through the first substrate 11 that is susceptible to moisture permeation and may also provide a flat surface. The buffer layer 12 may be formed of inorganic layers stacked on one another alternately. For example, the buffer layer 12 may be made of (or include) multiple layers in which inorganic layers including at least one of a silicon oxide ($SiO_x$), a silicon nitride ($SiN_x$) and silicon oxynitride ($SiO_xN_y$) are stacked on one another alternately.

The semiconductor layer may be disposed on the buffer layer 12. The semiconductor layer may include the active layer ACT of the first transistor T1. These may be disposed to partially overlap with a gate electrode G1 of a first gate conductive layer, etc., which will be described below.

Although only the first transistor T1 among the transistors included in the sub-pixels PXn of the display device 10 is depicted in the drawing, the disclosure is not limited thereto. The display device 10 may include a larger number of transistors. For example, the display device 10 may include more than one transistor in addition to the first transistor T1, e.g., two or three transistors in each of the sub-pixels PXn.

The semiconductor layer may include polycrystalline silicon, monocrystalline silicon, an oxide semiconductor, etc. In case that the semiconductor layer includes an oxide semiconductor, each active layer ACT may include conductive regions ACT_a and ACT_b and a channel region ACT_c therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), indium-gallium-zinc-tin oxide (IGZTO), etc.

In other embodiments, the semiconductor layer may include polycrystalline silicon. The polycrystalline silicon may be formed by crystallizing amorphous silicon, and in such case, the conductive regions of the active layer ACT may be doped regions doped with impurities.

The first gate insulating layer 13 may be disposed on the semiconductor layer and the buffer layer 12. The first gate insulating layer 13 may include a semiconductor layer and may be disposed on the buffer layer 12. The first gate insulating layer 13 may work as a gate insulator of each of the thin-film transistors. The first gate insulating layer 13 may be formed of an inorganic layer including an inorganic material, such as silicon oxide ($SiO_x$), silicon nitride ($SiN_x$) and silicon oxynitride ($SiO_xN_y$) or may be formed of a stack of the materials.

The first gate conductive layer may be disposed on the first gate insulating layer 13. The first gate conductive layer may include the gate electrode G1 of the first transistor T1 and a first capacitor electrode CSE1 of a storage capacitor. The gate electrode G1 may be disposed so that it overlaps the channel region ACT_c of the active layer ACT in the thickness direction. The first capacitor electrode CSE1 may be disposed so that it overlaps a second capacitor electrode CSE2 described below in the thickness direction. According to an embodiment of the disclosure, the first capacitor electrode CSE1 may be integrated with or integral with the gate electrode G1. The first capacitor electrode CSE1 may be disposed so that it overlaps the second capacitor electrode CSE2 in the thickness direction, and the storage capacitor may be formed between them.

The first gate conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first interlayer dielectric layer 15 may be disposed on the first gate conductive layer. The first interlayer dielectric layer 15 may function as an insulating layer between the first gate conductive layer and other layers disposed thereon. The first interlayer dielectric layer 15 may be disposed so that it covers or overlaps the first gate conductive layer to protect it. The first interlayer dielectric layer 15 may be formed of (or include) an inorganic layer including an inorganic material, such as silicon oxide ($SiO_x$), silicon nitride ($SiN_x$) and silicon oxynitride ($SiO_xN_y$) or may be formed of a stack of the materials.

The first data conductive layer may be disposed on the first interlayer dielectric layer 15. The first data conductive layer may include a first source electrode S1 and a first drain electrode D1 of the first transistor T1, a data line DTL, and a second capacitor electrode CSE2.

The first source electrode S1 and the first drain electrode D1 of the first transistor T1 may electrically contact the doped regions ACT_a and ACT_b of the active layer ACT, respectively, through the contact holes penetrating through the first interlayer dielectric layer 15 and the first gate insulating layer 13. The first source electrode S1 of the first transistor T1 may be electrically connected to the light-blocking layer BML through another contact hole.

The data line DTL may apply a data signal to another transistor (not shown) included in the display device 10. Although not shown in the drawings, the data line DTL may be electrically connected to the source/drain electrodes of another transistor to transfer a signal applied from the data line DTL.

The second capacitor electrode CSE2 may be disposed to overlap the first capacitor electrode CSE1 in the thickness direction. According to an embodiment of the disclosure, the second capacitor electrode CSE2 may be connected to and integral with the first source electrode S1.

The first data conductive layer may be made of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The second interlayer dielectric layer 17 may be disposed on the first data conductive layer. The second interlayer dielectric layer 17 may function as an insulating layer between the first data conductive layer and other layers disposed thereon. The second interlayer dielectric layer 17 may cover or overlap the first data conductive layer to protect it. The second interlayer dielectric layer 17 may be formed of an inorganic layer including an inorganic material, such as silicon oxide ($SiO_x$), silicon nitride ($SiN_x$) and silicon oxynitride ($SiO_xN_y$) or may be formed of a stack of the materials.

The second data conductive layer may be disposed on the second interlayer dielectric layer 17. The second data conductive layer may include a first voltage line VL1, a second voltage line VL2, and a first conductive pattern CDP. A high-level voltage (or a first supply voltage) may be applied to the first voltage line VL1 to be supplied to the first transistor T1, and a low-level voltage (or a second supply voltage) may be applied to the second voltage line VL2 to be supplied to the second electrode 22. An alignment signal for aligning the light-emitting elements 30 during the process of fabricating the display device 10 may be applied to the second voltage line VL2.

The first conductive pattern CDP may be electrically connected to the second capacitor electrode CSE2 through a contact hole formed in the second interlayer dielectric layer 17. The second capacitor electrode CSE2 may be integral with the first source electrode S1 of the first transistor T1, and the first conductive pattern CDP may be electrically connected to the first source electrode S1. The first conductive pattern CDP may electrically contact the first electrode 21 described below. The first transistor T1 may transfer the first supply voltage applied from the first voltage line VL1 to the first electrode 21 through the first conductive pattern CDP. Although the second data conductive layer includes a second voltage line VL2 and a first voltage line VL1 in the example shown in the drawings, the disclosure is not limited thereto. The second data conductive layer may include more than one first voltage line VL1 and second voltage line VL2.

The second data conductive layer may be made of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first planarization layer 19 may be disposed on the second data conductive layer. The first planarization layer 19 may include an organic insulating material, e.g., an organic material such as polyimide (PI), to provide a flat surface.

On the first planarization layer 19, first banks BNL1, electrodes 21 and 22, a light-emitting element 30, contact electrodes CNE1 and CNE2, and a second bank BNL2 may be disposed. Insulating layers PAS1, PAS2, PAS3 and PAS4 may be disposed on the first planarization layer 19.

The first banks BNL1 may be disposed directly on the first planarization layer 19. The first banks BNL1 may have a shape extending in the second direction DR2 within each of the sub-pixels PXn and may not extend to an adjacent sub-pixel PXn in the second direction DR2. They may be disposed in the emission area EMA. The first banks BNL1 are spaced apart from each other in the first direction DR1, and the light-emitting elements 30 may be disposed therebetween. The first banks BNL1 may be disposed in each of the sub-pixels PXn to form a linear pattern in the display area DPA of the display device 10. Although two first banks BNL1 are shown in the drawings, the disclosure is not limited thereto. More than two first banks BNL1 may be disposed depending on the number of electrodes 21 and 22.

The first banks BNL1 may have a structure that at least partly protrudes from the upper surface of the first planarization layer 19. The protrusions of the first banks BNL1 may have inclined side surfaces. The light emitted from the light-emitting elements 30 may be reflected by the electrodes 21 and 22 disposed on the first banks BNL1 so that the light may exit toward the upper side of the first planarization layer 19. The first banks BNL1 may provide the area in which the light-emitting element 30 is disposed and may also function as reflective partition walls that reflect light emitted from the light-emitting element 30 upward. The side surfaces of the first banks BNL1 may be inclined in a linear shape, but the disclosure is not limited thereto. The first banks BNL1 may have a semicircle or semi-ellipse shape with curved outer surface. The first banks BNL1 may include, but is not limited to, an organic insulating material such as polyimide (PI).

The electrodes 21 and 22 may be disposed on the first banks BNL1 and the first planarization layer 19. The electrodes 21 and 22 may include the first electrode 21 and the second electrode 22. The electrodes 21 and 22 may extend in the second direction DR2 and may be spaced apart from each other in the first direction DR1.

The first electrode 21 and the second electrode 22 may extend in the second direction DR2 in each of the sub-pixels PXn, and they may be spaced apart from other electrodes 21 and 22 in the cut area CBA. For example, the cut area CBA may be disposed between the emission areas EMA of the neighboring sub-pixels PXn in the second direction DR2, and the first electrode 21 and the second electrode 22 may be separated from other first electrode 21 and second electrode 22 disposed in an adjacent sub-pixel PXn in the second direction DR2 in the cut area CBA. It is, however, to be understood that the disclosure is not limited thereto. Some electrodes 21 and 22 may not be separated for each of the sub-pixels PXn but may extend and be disposed across adjacent sub-pixels PXn in the second direction DR2. As another example, only one of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, an extending part of the first electrode 21 in the first direction DR1 of the second bank BNL2 may electrically contact the first conductive pattern CDP through the first contact hole CT1 penetrating through the first planarization layer 19. An extending part of the second electrode 22 in the first direction DR1 of the second bank BNL2 may electrically contact the second voltage line VL2 through the second contact hole CT2 penetrating through the first planarization layer 19. It is, however, to be understood that the disclosure is not limited thereto. According to another embodiment, the first contact hole CT1 and the second contact hole CT2 may be formed in the emission area EMA surrounded by the second bank BNL2 so that they do not overlap the second bank BNL2.

Although one first electrode 21 and one second electrode 22 are disposed for each of the sub-pixels PXn in the drawings, the disclosure is not limited thereto. More than one first electrode 21 and more than one second electrode 22 may be disposed in each of the sub-pixels PXn. The first electrode 21 and the second electrode 22 disposed in each of the sub-pixels PXn may not have a shape extending in a direction and may have a variety of structures. For example, the first electrode 21 and the second electrode 22 may have a partially curved or bent shape, and an electrode may be disposed to surround another electrode.

The first electrode 21 and the second electrode 22 may be disposed directly on the first banks BNL1, respectively. The first electrode 21 and the second electrode 22 may have a larger width than the first banks BNL1. For example, the first electrode 21 and the second electrode 22 may be disposed to cover or overlap the outer surfaces of the first banks BNL1. The first electrode 21 and the second electrode 22 may be respectively disposed on the side surfaces of the first banks BNL1, and the distance between the first electrode 21 and the second electrode 22 may be smaller than the distance between the first banks BNL1. At least a part of the first electrode 21 and the second electrode 22 may be disposed directly on the first planarization layer 19 so that they may be located on the same plane. It is, however, to be understood that the disclosure is not limited thereto. In some embodiments, the electrodes 21 and 22 may have a width smaller than that of the first banks BNL1. It is to be noted that the electrodes 21 and 22 may be disposed to overlap at least one side surface of the first banks BNL1 to reflect light emitted from the light-emitting element 30.

Each of the electrodes 21 and 22 may include a conductive material having a high reflectance. For example, each of the electrodes 21 and 22 may include a metal such as silver (Ag), copper (Cu), and aluminum (Al) as the material having a high reflectance, and may be an alloy including aluminum (Al), nickel (Ni), lanthanum (La), etc. Each of the electrodes 21 and 22 may reflect light that is emitted from the light-emitting element 30 and travels toward the side surfaces of the first banks BNL1 toward the upper side of each of the sub-pixels PXn.

It is, however, to be understood that the disclosure is not limited thereto. Each of the electrodes 21 and 22 may further include a transparent conductive material. For example, each of the electrodes 21 and 22 may include a material such as indium tin oxide (ITO), indium zinc oxide (IZO) and indium tin zinc oxide (ITZO). In some embodiments, each of the electrodes 21 and 22 may have a structure in which one or more layers of a transparent conductive material and a metal layer having high reflectivity are stacked, or may be made of a single layer including them. For example, each of the electrodes 21 and 22 may have a stack structure such as ITO/silver (Ag)/ITO/, ITO/Ag/IZO, or ITO/Ag/ITZO/IZO.

The electrodes 21 and 22 may be electrically connected to the light-emitting elements 30, and a predetermined voltage may be applied so that the light-emitting elements 30 can emit light. The electrodes 21 and 22 may be electrically connected to the light-emitting element 30 through the contact electrodes CNE1 and CNE2, and may transfer electrical signals applied thereto to the light-emitting element 30 through the contact electrodes CNE1 and CNE2.

One of the first electrode 21 and the second electrode 22 may be electrically connected to an anode electrode of the light-emitting element 30, while the other one may be electrically connected to a cathode electrode of the light-emitting element 30. It is, however, to be understood that the disclosure is not limited thereto.

The electrodes 21 and 22 may be utilized to form an electric field within the sub-pixel PXn to align the light-emitting elements 30. The light-emitting elements 30 may be disposed between the first electrode 21 and the second electrode 22 by an electric field formed on the first electrode 21 and the second electrode 22. The light-emitting elements 30 of the display device 10 may be sprayed on the electrodes 21 and 22 via an inkjet printing process. In case that droplets of the ink containing the light-emitting elements 30 are applied or ejected onto the electrodes 21 and 22, an alignment signal may be applied to the electrodes 21 and 22 to generate an electric field. The light-emitting elements 30 dispersed in the ink may be aligned on the electrodes 21 and 22 by receiving the electrophoretic force by the electric field generated over the electrodes 21 and 22.

The first insulating layer PAS1 may be disposed on the first planarization layer 19. The first insulating layer PAS1 may be disposed to overlap the first banks BNL1 and the first electrode 21 and the second electrode 22. The first insulating layer PAS1 can protect the first electrode 21 and the second electrode 22 and insulate them from each other. It can prevent the light-emitting element 30 disposed on the first insulating layer PAS1 from being damaged by contacting other elements.

According to an embodiment of the disclosure, the first insulating layer PAS1 may include openings OP partially exposing the first electrode 21 and the second electrode 22. The openings OP may partially expose portions of the electrodes 21 and 22 disposed on the upper surface of the first banks BNL1. Part of the contact electrodes CNE1 and CNE2 may electrically contact the electrodes 21 and 22 exposed through the openings OP, respectively.

The first insulating layer PAS1 may have a level difference (or height difference) so that a part of the upper surface is recessed between the first electrode 21 and the second electrode 22. For example, as the first insulating layer PAS1 is disposed to overlap the first electrode 21 and the second electrode 22, the upper surface thereof may have level differences along the shape of the electrodes 21 and 22 disposed thereunder. It is, however, to be understood that the disclosure is not limited thereto.

The second bank BNL2 may be disposed on the first insulating layer PAS1. The second bank BNL2 may be disposed in a lattice pattern on the entire surface of the display area DPA including portions extending in the first direction DR1 and the second direction DR2 in a plan view. The second bank BNL2 may be disposed along the border of each of the sub-pixels PXn to distinguish adjacent sub-pixels PXn from one another.

The second bank BNL2 may be disposed to surround the emission area EMA and the cut area CBA disposed in each of the sub-pixels PXn to distinguish them. The first electrode 21 and the second electrode 22 may extend in the second direction DR2 and may be disposed across a portion of the second bank BNL2 that extends in the first direction DR1. The part of the second bank BNL2 extending in the second direction DR2 may have a larger width between the emission areas EMA than between the cut areas CBA. Accordingly, the distance between the cut areas CBA may be smaller than the distance between the emission areas EMA.

The second bank BNL2 may have a height greater than a height of the first banks BNL1. The second bank BNL2 can prevent the ink in which different light-emitting elements 30 are dispersed from overflowing to adjacent sub-pixels PXn during the inkjet printing process of the processes of fabricating the display device 10, so that different sub-pixels PXn can be separated from one another and the ink is not mixed. The second bank BNL2 may include, but is not limited to, polyimide (PI), similar to the first banks BNL1.

The light-emitting elements 30 may be disposed on the first insulating layer PAS1. The light-emitting elements 30 may be spaced apart from one another in the second direction DR2 in which the electrodes 21 and 22 extend, and may be aligned substantially parallel to one another. The light-emitting elements 30 may have a shape extending in a direction. The direction in which the electrodes 21 and 22 extend may be substantially perpendicular to the direction in which the light-emitting elements 30 extend. It is, however, to be understood that the disclosure is not limited thereto. The light-emitting elements 30 may be oriented obliquely to the direction in which the electrodes 21 and 22 extend, rather than being perpendicular to it.

The light-emitting elements 30 disposed in each of the sub-pixels PXn may include the light-emitting layer 36 (see FIG. 4) including different materials and may emit lights with different wavelength ranges to the outside. Accordingly, lights of the first color, the second color, and the third color may exit from the first sub-pixel PX1, the second sub-pixel PX2, and the third sub-pixel PX3, respectively. It is, however, to be understood that the disclosure is not limited thereto. The sub-pixels PXn may include the same kind of light-emitting elements 30 and may emit light of substantially the same color.

Both ends of the elements 30 may be disposed on the electrodes 21 and 22 between the first banks BNL1. The length of the light-emitting elements 30 may be larger than the distance between the first electrode 21 and the second electrode 22, and both ends of the light-emitting elements 30 may be disposed on the first electrode 21 and the second electrode 22, respectively. For example, one end of each of the light-emitting elements 30 may be located on the first electrode 21, while the other end thereof may be located on the second electrode 22.

Multiple layers of the light-emitting elements 30 may be disposed in the direction perpendicular to the upper surface of the first substrate 11 or the first planarization layer 19. The light-emitting elements 30 may be arranged such that they extend in an extending direction parallel to the upper surface of the first planarization layer 19, and semiconductor layers included in the light-emitting elements 30 may be disposed sequentially in the direction parallel to the upper surface of the first planarization layer 19. It is, however, to be understood that the disclosure is not limited thereto. In case that the light-emitting elements 30 has a different structure, semiconductor layers may be arranged in the direction perpendicular to the upper surface of the first planarization layer 19.

The ends of each of the light-emitting elements 30 may electrically contact the contact electrodes CNE1 and CNE2, respectively. For example, a part of the semiconductor layers 31 and 32 (see FIG. 4) or the electrode layer 37 (see FIG. 4) of the light-emitting element 30 may be exposed because the insulating film 38 (see FIG. 4) is not formed at the end surfaces on the sides of the extending direction, and the exposed part of the semiconductor layers 31 and 32 or the electrode layer 37 may electrically contact the contact electrode CNE1 and CNE2. It is, however, to be understood that the disclosure is not limited thereto. At least a part of the insulating film 38 may be removed so that both end surfaces of the semiconductor layers 31 and 32 of the light-emitting element 30 may be partially exposed. The exposed side surfaces of the semiconductor layers 31 and 32 may electrically contact the contact electrodes CNE1 and CNE2.

The second insulating layer PAS2 may be partially disposed on the light-emitting elements 30. For example, the second insulating layer PAS2 may have a width smaller than the length of the light-emitting elements 30 and may be disposed on the light-emitting elements 30 so that both ends of the light-emitting elements 30 are exposed while being surrounded by it. The second insulating layer PAS2 may be disposed to overlap the light-emitting elements 30, the electrodes 21 and 22, and the first insulating layer PAS1 and then may be removed so that both ends of the light-emitting elements 30 are exposed during the process of fabricating the display device 10. The second insulating layer PAS2 may extend in the second direction DR2 on the first insulating layer PAS1 in a plan view, thereby forming a linear or island-like pattern in each of the sub-pixels PXn. The second passivation layer PAS2 can protect the light-emitting elements 30 and affix the light-emitting element 30 during the process of fabricating the display device 10.

Contact electrodes CNE1 and CNE2 and a third insulating layer PAS3 may be disposed on the second insulating layer PAS2.

The contact electrodes CNE1 and CNE2 may have a shape extending in a direction and may be disposed on the electrodes 21 and 22. The contact electrodes CNE1 and CNE2 may include a first contact electrode CNE1 disposed on the first electrode 21 and a second contact electrode CNE2 disposed on the second electrode 22. The contact electrodes CNE1 and CNE2 may be disposed spaced apart from each other or face each other. For example, the first contact electrode CNE1 and the second contact electrode CNE2 may be disposed on the first electrode 21 and the second electrode 22, respectively, and may be spaced apart from each other in the first direction DR1. The contact electrodes CNE1 and CNE2 may form a stripe pattern in the emission area EMA of each of the sub-pixels PXn.

Each of the contact electrodes CNE1 and CNE2 may electrically contact the light-emitting elements 30. The first contact electrode CNE1 may electrically contact first end of each of the light-emitting elements 30, and the second contact electrode CNE2 may electrically contact second end of each of the light-emitting elements 30. The semiconductor layers are exposed at both end surfaces of the light-emitting elements 30 in the extending direction, and the contact electrodes CNE1 and CNE2 may electrically contact the semiconductor layers and may be electrically connected to them. The sides of the contact electrodes CNE1 and CNE2 electrically contacting both ends of the light-emitting elements 30 may be disposed on the second insulating layer PAS2. The first contact electrode CNE1 may electrically contact the first electrode 21 through an opening OP exposing a part of the upper surface of the first electrode 21, and the second contact electrode CNE2 may electrically contact the second electrode through an opening OP exposing a part of the upper surface of the second electrode 22.

The width of the contact electrodes CNE1 and CNE2 that is measured in a direction may be smaller than the width of the electrodes 21 and 22 that is measured in the direction. The contact electrodes CNE1 and CNE2 may electrically contact the first and second ends of the light-emitting elements 30 and may overlap a part of the upper surface of each of the first electrode 21 and the second electrode 22. It is, however, to be understood that the disclosure is not limited thereto. The width of the contact electrodes CNE1 and CNE2 may be larger than that of the electrodes 21 and 22 to overlap both sides of the electrodes 21 and 22.

The contact electrodes CNE1 and CNE2 may include a transparent, conductive material. For example, the contact electrodes may include ITO, IZO, ITZO, aluminum (Al), etc. Light emitted from the light-emitting elements 30 may pass through the contact electrodes CNE1 and CNE2 and travel toward the electrodes 21 and 22. It is, however, to be understood that the disclosure is not limited thereto.

Although the two contact electrodes CNE1 and CNE2 are disposed in a sub-pixel PXn in the drawings, the disclosure is not limited thereto. The number of the contact electrodes CNE1 and CNE2 may vary depending on the number of electrodes 21 and 22 disposed for each of the sub-pixels PXn.

The third insulating layer PAS3 may be disposed to overlap the first contact electrode CNE1. The third insulating layer PAS3 may be disposed to overlap a side of the second insulating layer PAS2 on which the first contact electrode CNE1 is disposed. For example, the third insulating layer PAS3 may be disposed to overlap the first contact electrode CNE1 and the first insulating layers PAS1 disposed on the first electrode 21. Such arrangement may be formed by disposing an insulating material layer for forming the third insulating layer PAS3 entirely on the emission area EMA, and removing a part of the insulating material layer in order to form the second contact electrode CNE2. During the above process, the insulating material layer forming the third insulating layer PAS3 may be removed together with the insulating material layer forming the second insulating layer PAS2. A side of the third insulating layer PAS3 may be aligned with a side of the second insulating layer PAS2. A side of the second contact electrode CNE2 may be disposed on the third insulating layer PAS3 and may be insulated from the first contact electrode CNE1 with the third insulating layer PAS3 therebetween.

The fourth insulating layer PAS4 may be disposed entirely on the display area DPA of the first substrate 11. The fourth insulating layer PAS4 can protect the elements disposed on the first substrate 11 against the external environment. It is to be noted that the fourth insulating layer PAS4 may be omitted.

Each of the above-described first insulating layer PAS1, second insulating layer PAS2, third insulating layer PAS3, and fourth insulating layer PAS4 may include an inorganic insulating material or an organic insulating material. For example, the first insulating layer PAS1, the second insulating layer PAS2, the third insulating layer PAS3 and the fourth insulating layer PAS4 may include an inorganic insulating material such as silicon oxide ($SiO_x$), silicon nitride ($SiN_x$), silicon oxynitride ($SiO_xN_y$), aluminum oxide ($Al_2O_3$) and aluminum nitride (AlN). As another example, they may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc. It is, however, to be understood that the disclosure is not limited thereto.

Figure 4:
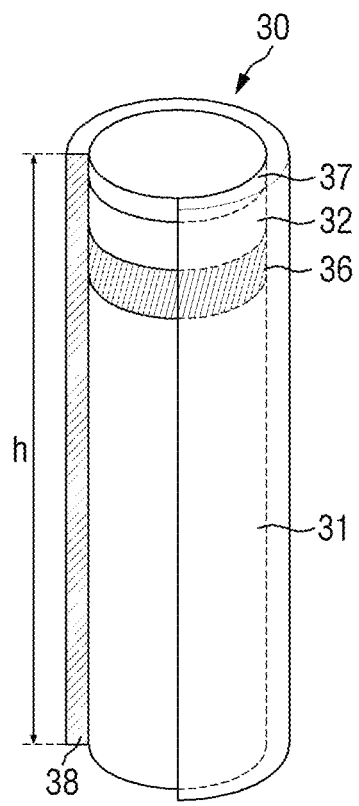
FIG. 4 is a schematic perspective view showing a light-emitting element according to an embodiment of the disclosure.

FIG. 4 is a schematic perspective view showing a light-emitting element according to an embodiment of the disclosure.

The light-emitting element 30 may be a light-emitting diode. Specifically, the light-emitting element 30 may have a size in a range of micrometers to nanometers and may be an inorganic light-emitting diode made of an inorganic material. Inorganic light-emitting diodes may be aligned between two electrodes facing each other as polarities are created by forming an electric field in a particular direction between the two electrodes. The light-emitting elements 30 may be aligned between two electrodes by an electric field formed over the two electrodes.

The light-emitting element 30 according to an embodiment may have a shape extended in a direction. The light-emitting element 30 may have a shape of a cylinder, a rod, a wire, a tube, etc. It is to be understood that the shape of the light-emitting element 30 is not limited thereto. The light-emitting element 30 may have a variety of shapes including a polygonal column shape such as a cube, a cuboid and a hexagonal column, or a shape that extends in a direction with partially inclined outer surfaces. The semiconductors included in the light-emitting element 30 to be described later may have a structure sequentially arranged or stacked along the direction.

The light-emitting element 30 may include a semiconductor layer doped with impurities of a conductive type (e.g., p-type or n-type). The semiconductor layers may emit light of a certain wavelength band by transmitting an electric signal applied from an external power source.

Referring to FIG. 4, the light-emitting element 30 may include a first semiconductor layer 31, a second semiconductor layer 32, a light-emitting layer 36, an electrode layer 37, and an insulating layer 38.

The first semiconductor layer 31 may be an n-type semiconductor. In case that the light-emitting element 30 emits light of a blue wavelength band, the first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of n-type doped AlGaInN, GaN, AlGaN, InGaN, AlN and InN. The first semiconductor layer 31 may be doped with an n-type dopant, and the n-type dopant may be Si, Ge, Sn, etc. For example, the first semiconductor layer 31 may be n-GaN doped with n-type Si. The length of the first semiconductor layer 31 may range, but is not limited to, from about 1.5 μm to about 5 μm.

The second semiconductor layer 32 may be disposed on the light-emitting layer 36 described below. The second semiconductor layer 32 may be a p-type semiconductor. In case that the light-emitting element 30 emits light of a blue or green wavelength band, the second semiconductor layer 32 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of p-type doped AlGaInN, GaN, AlGaN, InGaN, AlN and InN. The second semiconductor layer 32 may be doped with a p-type dopant, and the p-type dopant may be Mg, Zn, Ca, Se, Ba, etc. For example, the second semiconductor layer 32 may be p-GaN doped with p-type Mg. The length of the second semiconductor layer 32 may range, but is not limited to, from about 0.05 μm to about 0.10 μm.

Although each of the first semiconductor layer 31 and the second semiconductor layer 32 is implemented as a signal layer in the drawings, the disclosure is not limited thereto. Depending on the material of the light-emitting layer 36, the first semiconductor layer 31 and the second semiconductor layer 32 may further include a larger number of layers, e.g., a clad layer or a tensile strain barrier reducing (TSBR) layer.

The light-emitting layer 36 may be disposed between the first semiconductor layer 31 and the second semiconductor layer 32. The light-emitting layer 36 may include a material having a single or multiple quantum well structure. In case that the light-emitting layer 36 includes a material having the multiple quantum well structure, the structure may include quantum layers and well layers alternately stacked on one another. The light-emitting layer 36 may emit light as electron-hole pairs are combined therein in response to an electrical signal applied through the first semiconductor layer 31 and the second semiconductor layer 32. In case that the light-emitting layer 36 emits light of the blue wavelength band, it may include a material such as AlGaN and AlGaInN. In particular, in case that the light-emitting layer 36 has a multi-quantum well structure in which quantum layers and well layers are alternately stacked on one another, the quantum layers may include AlGaN or AlGaInN, and the well layers may include a material such as GaN and AlGaN. For example, the light-emitting layer 36 includes AlGaInN as the quantum layer and AlInN as the well layer, and, as described above, the light-emitting layer 36 may emit blue light having a center wavelength band of about 450 nm to about 495 nm.

It is, however, to be understood that the disclosure is not limited thereto. The light-emitting layer 36 may have a structure in which a semiconductor material having a large band gap energy and a semiconductor material having a small band gap energy are alternately stacked on one another and may include other Group III to Group V semiconductor materials depending on the wavelength range of the emitted light. Accordingly, the light emitted from the light-emitting layer 36 is not limited to the light of the blue wavelength band. The light-emitting layer 36 may emit light of red or green wavelength band in some implementations. The length of the light-emitting layer 36 may be, but is not limited to, in the range of about 0.05 μm to about 0.10 μm.

The light emitted from the light-emitting layer 36 may exit not only through the outer surfaces of the light-emitting element 30 in the longitudinal direction but also through both side surfaces. The direction in which the light emitted from the light-emitting layer 36 propagates is not limited to a direction.

The electrode layer 37 may be an ohmic contact electrode. It is, however, to be understood that the disclosure is not limited thereto. The element electrode layer may be Schottky contact electrodes. The light-emitting element 30 may include at least one electrode layer 37. Although the light-emitting element 30 includes an electrode layer 37 in the example shown in FIG. 4, the disclosure is not limited thereto. In some implementations, the light-emitting element 30 may include a larger number of electrode layers 37, or the electrode layer may be omitted. The following description on the light-emitting element 30 may be equally applied even if the number of electrode layers 37 is different or it further includes other structures.

The electrode layer 37 can reduce the resistance between the light-emitting element 30 and the electrodes or the contact electrodes in case that the light-emitting element 30 is electrically connected to the electrodes or the contact electrodes in the display device 10 according to the embodiment of the disclosure. The electrode layer 37 may include a metal having conductivity. For example, the electrode layer 37 may include at least one of aluminum (Al), titanium (Ti), indium (In), gold (Au), silver (Ag), indium tin oxide (ITO), indium zinc oxide (IZO) and indium tin-zinc oxide (ITZO). The electrode layer 37 may include a semiconductor material doped with n-type or p-type impurities. The electrode layer 37 may include the same material or may include different materials. It is, however, to be understood that the disclosure is not limited thereto.

The insulating film 38 may be disposed to surround outer surfaces of the semiconductor layers and electrode layers described above. For example, the insulating film 38 may be disposed to surround at least the outer surface of the light-emitting layer 36 and may extend in a direction in which the light-emitting element 30 extends. The insulating film 38 may protect the above-described elements. The insulating film 38 may be formed to surround the side surfaces of the elements, and both ends of the light-emitting element 30 in the longitudinal direction may be exposed.

Although the insulating film 38 extends in the longitudinal direction of the light-emitting element 30 to cover or overlap from the first semiconductor layer 31 to the side surface of the electrode layer 37 in the example shown in the drawing, the disclosure is not limited thereto. The insulating film 38 may cover only the outer surface of a part of the semiconductor layer, including the light-emitting layer 36, or may cover only a part a part of the outer surface of the electrode layer 37 to partially expose the outer surface of the electrode layer 37. A part of the upper surface of the insulating film 38 may be rounded which is adjacent to at least one end of the light-emitting element 30 in a cross section.

The thickness of the insulating film 38 may be, but is not limited to, in the range of about 10 nm to about 1.0 μm. Preferably, the thickness of the insulating film 38 may be about 40 nm.

The insulating film 38 may include materials having an insulating property such as silicon oxide ($SiO_x$), silicon nitride ($SiN_x$), silicon oxynitride ($SiO_xN_y$), aluminum nitride (AlN) and aluminum oxide ($Al_2O_3$). Accordingly, it is possible to prevent an electrical short-circuit that may occur in case that the light-emitting layer 36 electrically contacts an electrode through which an electric signal is transmitted to the light-emitting element 30. Since the insulating film 38 includes the light-emitting layer 36 to protect the outer surface of the light-emitting element 30, it is possible to prevent a decrease in luminous efficiency.

The outer surface of the insulating film 38 may be subjected to surface treatment. The light-emitting elements 30 may be dispersed in an ink, and droplets of the ink may be ejected onto the electrode. In doing so, a surface treatment may be applied to the insulating film 38 so that it becomes hydrophobic or hydrophilic in order to keep the light-emitting elements 30 dispersed in the ink from aggregating with one another. For example, the outer surface of the insulating film 38 may be subjected to a surface treatment with a material such as stearic acid and 2,3-naphthalene dicarboxylic acid.

The length h of the light-emitting elements 30 may range from about 1 μm to about 10 μm or from about 2 μm to about 6 μm, and preferably approximately about 3 μm to about 5 μm. The diameter of the light-emitting elements 30 may range from about 30 nm to about 700 nm, and the aspect ratio of the light-emitting elements 30 may range from about 1.2 to about 100. It is, however, to be understood that the disclosure is not limited thereto. The light-emitting elements 30 included in the display device 10 may have different diameters depending on compositional difference of the light-emitting layer 36. The diameter of the light-emitting elements 30 may be about 500 nm.

It is to be noted that the shape and material of the light-emitting element 30 are not limited to those described with reference to FIG. 4. In some embodiments, the light-emitting elements 30 may include a greater number of layers or may have different shapes.

Figure 5:
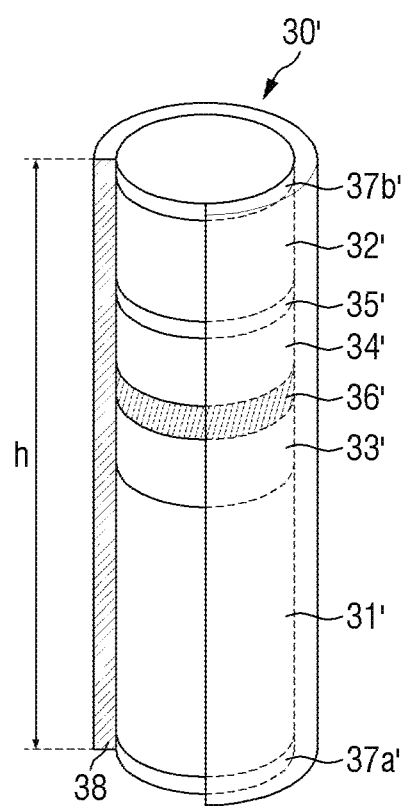
FIG. 5 is a schematic perspective view showing a light-emitting element according to another embodiment of the disclosure.

FIG. 5 is a schematic perspective view showing a light-emitting element according to another embodiment of the disclosure.

Referring to FIG. 5, a light-emitting element 30' according to an embodiment may further include a third semiconductor layer 33' disposed between a first semiconductor layer 31' and a light-emitting layer 36', and a fourth semiconductor layer 34' and a fifth semiconductor layer 35' disposed between the light-emitting layer 36' and the second semiconductor layer 32'. The light-emitting element 30' of FIG. 5 is different from the light-emitting element of FIG. 4 at least in that semiconductor layers 33', 34', and 35' and electrode layers 37a' and 37b' are further disposed and that the light-emitting layer 36' includes different elements. In the following description, descriptions will focus on the differences, and the redundant description will be omitted.

The light-emitting layer 36 of the light-emitting element 30 of FIG. 4 may include nitrogen (N) and may emit blue or green light. On the other hand, in the light-emitting element 30' of FIG. 5, the light-emitting layer 36' and other semiconductor layers each may be a semiconductor including at least phosphorus (P). The light-emitting element 30' according to the embodiment of the disclosure may emit red light having a center wavelength band of about 620 nm to about 750 nm. It is, however, to be understood that the center wavelength band of red light is not limited to the above numerical values and may encompass all wavelength ranges that can be recognized as red in the art.

Specifically, the first semiconductor layer 31' may include, as an n-type semiconductor layer, a semiconductor material having a chemical formula: $In_xAl_yGa_{1-x-y}P$ ($0 \leq x \leq 1$, $0 \leq y \leq 1$, $0 \leq x+y \leq 1$). The first semiconductor layer 31' may be one or more of n-type InAlGaP, GaP, AlGaP, InGaP, AlP and InP. For example, the first semiconductor layer 31' may be n-AlGaInP doped with n-type Si.

Specifically, the second semiconductor layer 32' may include, as a p-type semiconductor layer, a semiconductor material having a chemical formula: $In_xAl_yGa_{1-x-y}P$ ($0 \leq x \leq 1$, $0 \leq y \leq 1$, $0 \leq x+y \leq 1$). The second semiconductor layer 32' may be one or more of p-type InAlGaP, GaP, AlGaNP, InGaP, AlP and InP. For example, the second semiconductor layer 32' may be p-GaP doped with p-type Mg.

The light-emitting layer 36' may be disposed between the first semiconductor layer 31' and the second semiconductor layer 32'. The light-emitting layer 36' may include a material having a single or multiple quantum well structure and may emit light of a certain wavelength band. In case that the light-emitting layer 36' has a multi-quantum well structure in which quantum layers and well layers are alternately stacked on one another, the quantum layers may include AlGaP or AlInGaP, and the well layers may include GaP or AlInP. For example, the light-emitting layer 36' may include AlGaInP as the quantum layers and AlInP as the well layers and may emit red light having a central wavelength band of about 620 nm to about 750 nm.

The light-emitting element 30' of FIG. 5 may include a clad layer disposed adjacent to the light-emitting layer 36'. As shown in FIG. 5, the third semiconductor layer 33' and the fourth semiconductor layer 34' disposed under and on the light-emitting layer 36' between the first semiconductor layer 31' and the second semiconductor layer 32' may be clad layers.

The third semiconductor layer 33' may be disposed between the first semiconductor layer 31' and the light-emitting layer 36'. The third semiconductor layer 33' may be an n-type semiconductor similar to the first semiconductor layer 31', and may include a semiconductor material having a chemical formula: $In_xAl_yGa_{1-x-y}P$ ($0 \leq x \leq 1$, $0 \leq y \leq 1$, $0 \leq x+y \leq 1$). For example, the first semiconductor layer 31' may be n-AlGaInP, and the third semiconductor layer 33' may be n-AlInP. It is, however, to be understood that the disclosure is not limited thereto.

The fourth semiconductor layer 34' may be disposed between the light-emitting layer 36' and the second semiconductor layer 32'. The fourth semiconductor layer 34' may be an n-type semiconductor like the second semiconductor layer 32', and may include a semiconductor material having a chemical formula: $In_xAl_yGa_{1-x-y}P$ ($0 \leq x \leq 2$, $0 \leq y \leq 1$, $0 \leq x+y \leq 1$). For example, the second semiconductor layer 32' may be p-GaP, and the fourth semiconductor layer 34' may be p-AlInP.

The fifth semiconductor layer 35' may be disposed between the fourth semiconductor layer 34' and the second semiconductor layer 32'. The fifth semiconductor layer 35' may be a p-type doped semiconductor, similar to the second semiconductor layer 32' and the fourth semiconductor layer 34'. In some embodiments, the fifth semiconductor layer 35' may reduce a difference in lattice constant between the fourth semiconductor layer 34' and the second semiconductor layer 32'. The fifth semiconductor layer 35' may be a tensile strain barrier reducing (TSBR) layer. For example, the fifth semiconductor layer 35' may include, but is not limited to, p-GaInP, p-AlInP, p-AlGaInP, etc. The length of the third semiconductor layer 33', the fourth semiconductor layer 34' and the fifth semiconductor layer 35' may be, but is not limited to, a range of about 0.08 μmm to about 0.25 μm.

The first electrode layer 37a' and the second electrode layer 37b' may be disposed on the first semiconductor layer 31' and the second semiconductor layer 32', respectively. The first electrode layer 37a' may be disposed on the lower surface of the first semiconductor layer 31', and the second electrode layer 37b' may be disposed on the upper surface of the second semiconductor layer 32'. It is, however, to be understood that the disclosure is not limited thereto. At least one of the first electrode layer 37a' and the second electrode layer 37b' may be omitted. For example, in the light-emitting element 30', the first electrode layer 37a' may not be disposed on the lower surface of the first semiconductor layer 31', and only one second electrode layer 37b' may be disposed on the upper surface of the second semiconductor layer 32'.

The light-emitting elements 30 may be ejected onto the electrodes 21 and 22 by an inkjet printing process. The light-emitting elements 30 dispersed in a solvent may be ejected onto the electrodes 21 and 22, and an alignment signal is applied to the electrodes 21 and 22, so that the light-emitting elements can be disposed between the electrodes 21 and 22. In case that an alignment signal is applied to the electrodes 21 and 22, an electric field is formed over them, and the light-emitting elements 30 may receive a dielectrophoretic force by the electric field. In case that the light-emitting elements 30 receive the dielectrophoretic force, they may be disposed between the first electrode 21 and the second electrode 22 with their orientations and locations changed.

In doing so, the light-emitting elements 30 dispersed in the ink may stick together in the solvent due to the physical properties of the solvent. In that case, the light-emitting elements 30 stuck together may be aligned between the electrodes 21 and 22, and thus the light-emitting elements 30 may be poorly aligned. If the light-emitting elements 30 stuck together are disposed closer to one side of a sub-pixel, luminance in the sub-pixel becomes non-uniform.

According to an embodiment of the disclosure, the ink containing the light-emitting elements 30 may include a solvent having the Hansen solubility parameters of a polarity parameter and a hydrogen bonding parameter in predetermined ranges and/or an ester group, thereby increasing the dispersibility of the light-emitting elements 30. Accordingly, it is possible to suppress the light-emitting elements 30 from sticking together in dropping droplets of the ink containing the light-emitting elements 30 onto sub-pixels, thereby suppressing poor alignment and achieving uniform luminance in the sub-pixels.

Hereinafter, the ink containing the light-emitting elements 30 will be described.

Figure 6:
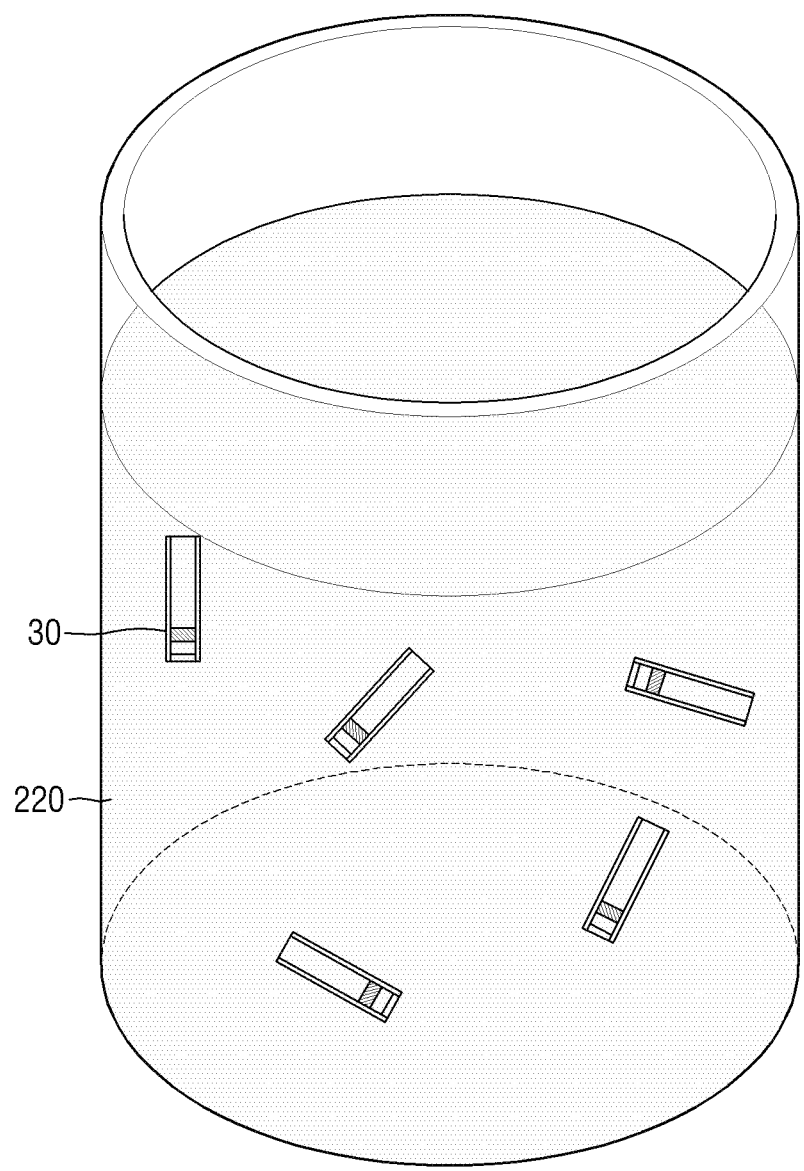
FIG. 6 is a perspective view schematically showing an ink containing light-emitting elements according to an embodiment of the disclosure.

FIG. 6 is a view schematically showing an ink containing light-emitting elements according to an embodiment of the disclosure.

Referring to FIG. 6, an ink 200 according to an embodiment of the disclosure may include a solvent 220 and light-emitting elements 30 dispersed in the solvent 220. The light-emitting elements 30 may be either the light-emitting element 30 or the light-emitting element 30' described above with reference to FIGS. 4 and 5. The light-emitting element 30 of FIG. 4 is shown in FIG. 6. The light-emitting elements 30 have already been described above, and thus the solvent 220 will be described in detail below.

The solvent 220 may store the light-emitting elements 30 each including semiconductor layers as they are dispersed therein and may be an organic solvent that does not react with the light-emitting elements 30. The solvent 220 may have such a viscosity that it can be discharged in a liquid state through a nozzle of an inkjet printing apparatus. The molecules of the solvent 220 may surround the surfaces of the light-emitting elements 30 and disperse the light-emitting elements 30. The ink 200 containing the light-emitting elements 30 may be prepared in a solution or colloid.

According to an embodiment of the disclosure, the solvent 220 may satisfy predetermined ranges of the Hansen solubility parameters. The Hansen solubility parameters include a dispersion parameter, a polarity parameter, and a hydrogen bonding parameter to exhibit solubility characteristics Among these, the solvent 220 according to an embodiment may satisfy the polarity parameter and the hydrogen bonding parameter in the predetermined ranges.

Specifically, the solvent 220 may have a polarity parameter (dP) ranging from about 4 to about 9. The polarity parameter represents interactions by polarities of molecules. It may exhibit a high value when a molecular structure is asymmetric. In addition, the solvent 220 may have a hydrogen bonding parameter (dH) ranging from about 6 to about 11. The hydrogen bonding parameter represents intermolecular hydrogen-bonding interactions. It can exhibit a higher value in case that there are more hydrogen bonding sites in the molecules.

Figure 7:
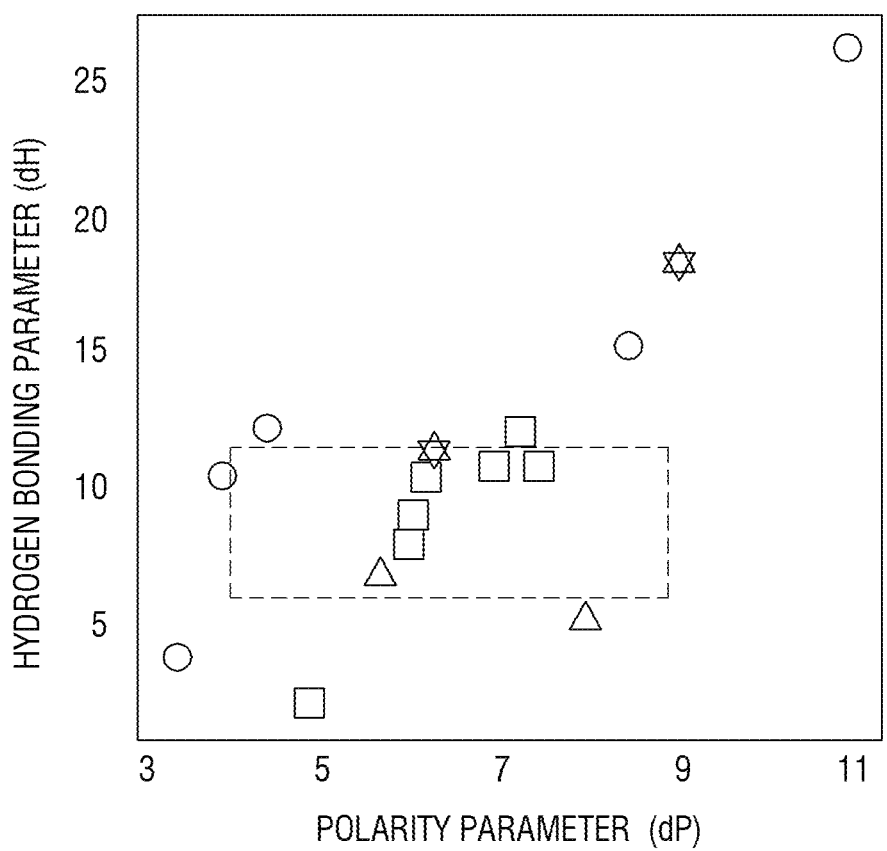
FIG. 7 is a graph showing the alignment degree of the light-emitting elements at the center depending on the polarity parameter and hydrogen bonding parameter of the solvent.

FIG. 7 is a graph showing the center alignment degree of the light-emitting elements depending on the polarity parameter and hydrogen bonding parameter of the solvent.

FIG. 7 schematically shows the center alignment degrees of the light-emitting elements by adjusting the ranges of the polarity parameter and hydrogen bonding parameter of the solvent 220. As used herein, the center alignment degree refers to the ratio of correctly aligned light-emitting elements to the total light-emitting elements in percentage in a sub-pixel. The points represent the center alignment degrees of the light-emitting elements. Specifically, the squares represent center alignment degrees from about 70 to about 100% of the light-emitting elements, the triangles represent the center alignment degrees from about 50 to about 60%, the stars represent the center alignment degrees from about 30 to about 50%, and the circles represent the center alignment degrees from about 0 to about 30%.

It can be seen from FIG. 7 that most of the points representing the center alignment degrees of the light-emitting elements from about 70 to about 100% are gathered in the ranges of the polarity parameter between about 4 to about 9 and the hydrogen bonding parameter between about 6 and about 11 of the solvent 220.

In view of the above, it can be seen that the optimal ranges of the polarity parameter and the hydrogen bonding parameter of the solvent 220 that can exhibit excellent center alignment degree of the light-emitting elements 30 are the polarity parameter of about 4 to about 9 and the hydrogen bonding parameter of about 6 to about 11.

Figure 8:
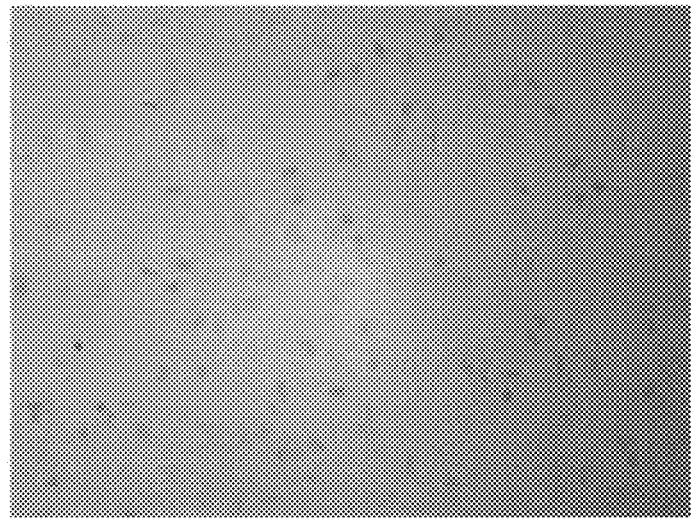
FIG. 8 shows an image of an ink in which the light-emitting elements are mixed according to an embodiment of the disclosure.
Figure 9:
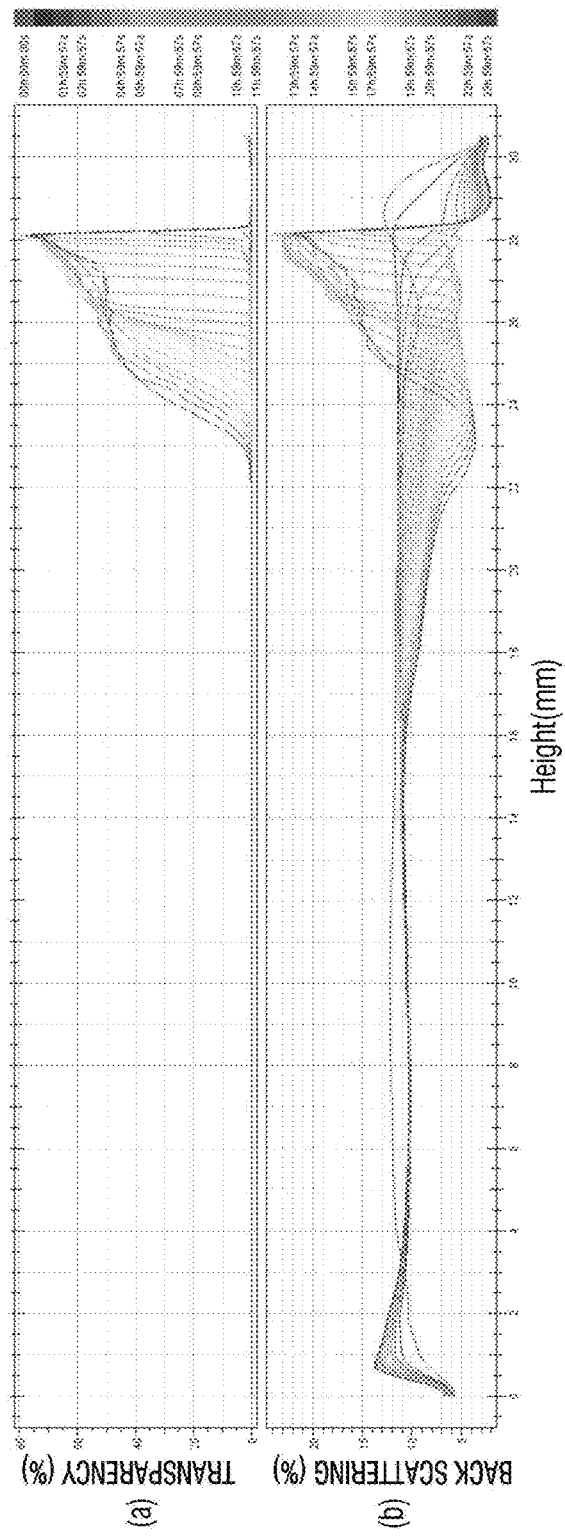
FIG. 9 shows graphs showing changes in transparency and concentration of the ink in which the light-emitting elements are mixed over time according to the embodiment of the disclosure.
Figure 10:
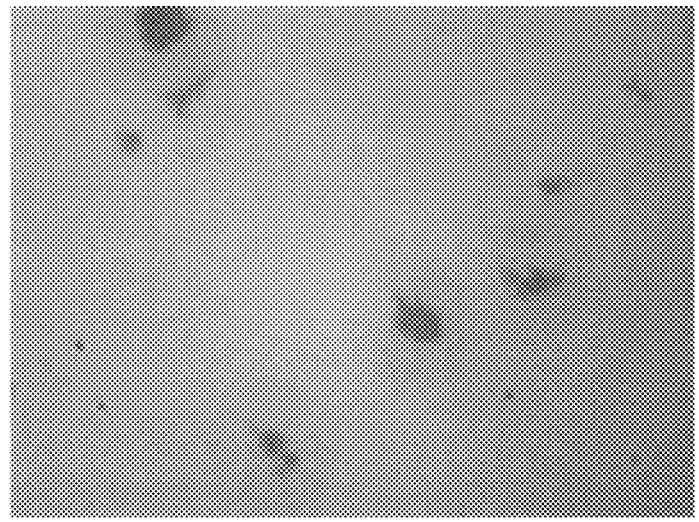
FIG. 10 shows an image of an ink in which the light-emitting elements are mixed according to Comparative Example.
Figure 11:
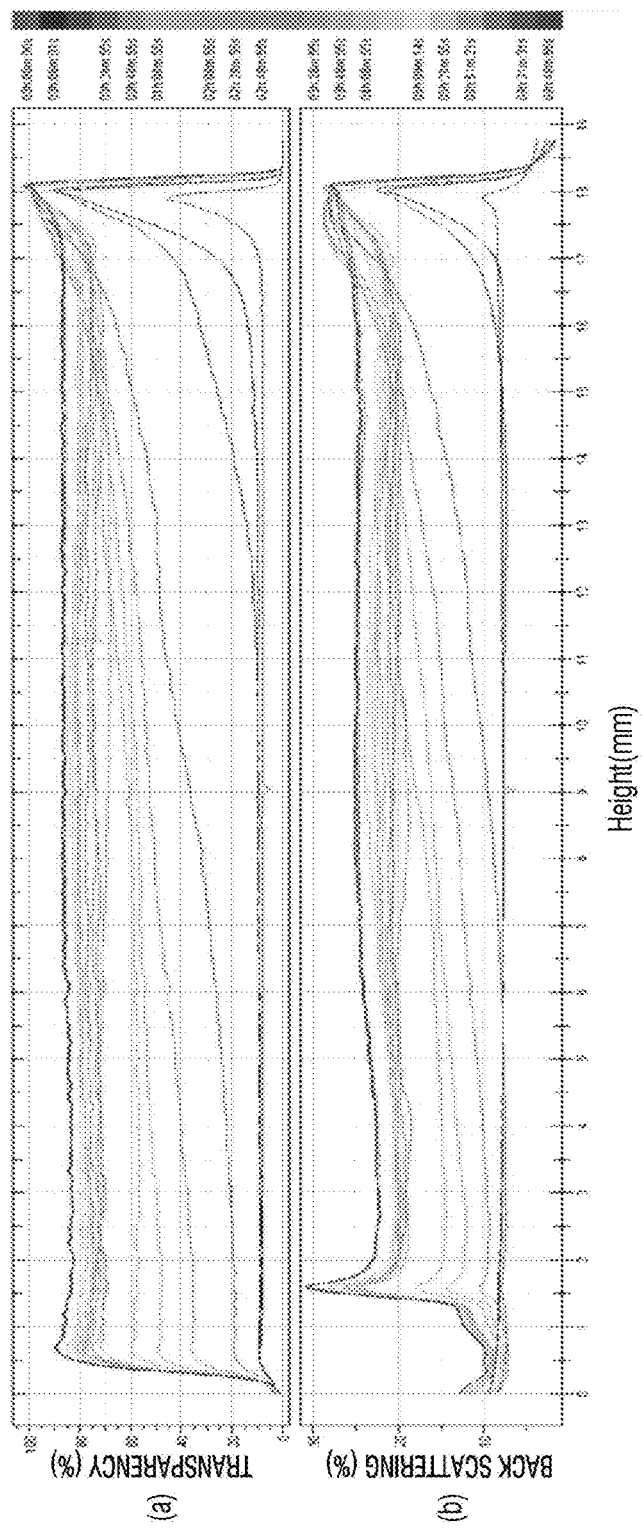
FIG. 11 shows graphs showing changes in transparency and concentration of the ink in which the light-emitting elements are mixed over time according to Comparative Examples.

FIG. 8 shows an image of an ink in which the light-emitting elements are mixed according to an embodiment of the disclosure. FIG. 9 shows graphs showing changes in transparency and concentration of the ink in which the light-emitting elements are mixed over time according to the embodiment of the disclosure. FIG. 10 shows an image of an ink in which the light-emitting elements are mixed according to Comparative Example. FIG. 11 shows graphs showing changes in transparency and concentration of the ink in which the light-emitting elements are mixed over time according to Comparative Examples.

First, FIG. 8 shows an ink obtained by mixing light-emitting elements 30 in a solvent 220 having a polarity parameter from about 4 to about 9 and a hydrogen bonding parameter from about 6 to about 11 at the concentration of about 0.1 wt %. It can be seen from FIG. 8 that the light-emitting elements 30 are evenly dispersed in the solvent.

Referring to FIG. 9, the horizontal axis of each of the graphs represents the height of bottles, with the leftmost being the bottom of a bottle while the rightmost being the top of the bottle. The vertical axis of graph (a) represents the transparency, and the vertical axis of graph (b) represents the back scattering. The lines indicated by different colors represent different times for 24 hours from the beginning of the measurement.

Referring to FIG. 9, the transparency and the back scattering were measured over time since the bottle is filled with the ink containing light-emitting elements according to an embodiment of the disclosure. Referring to graph (a), the transparency gradually increased over time at the top of the bottle, and the transparency was 0 in the entire remaining part of the bottle. Referring to graph (b), the value of the back scattering gradually decreased at the top of the bottle, and the value of the back scattering value was maintained in the entire remaining part of the bottle over time, like the transparency. It can be seen from the results that the light-emitting elements are evenly dispersed in the solvent of the ink according to the embodiment of the disclosure.

On the other hand, according to Comparative Examples of FIG. 10, an ink was obtained by mixing light-emitting elements 30 in a solvent 220 having a polarity parameter and a hydrogen bonding parameter out of the above ranges at the concentration of about 0.1 wt %. It can be seen from FIG. 10 that the light-emitting elements 30 are sticking together in the solvent.

Referring to FIG. 11, the transparency and the back scattering were measured over time since a bottle is filled with the ink containing light-emitting elements according to Comparative Example. Referring to graph (a), the transparency was about 80% or higher over time throughout the bottle. Referring to graph (b), the value of the back scattering also exhibited values from about 20 to about 25% over time throughout the bottle, like the transparency. It can be seen from the results that most of the light-emitting elements sticked together in the solvent of the ink and sank to the bottom of the bottle in a short period of time according to Comparative Example.

In view of the above, the solvent 220 according to the embodiment of the disclosure can improve the dispersibility of the light-emitting elements 30 as it has a polarity parameter from about 4 to about 9 and a hydrogen bonding parameter from about 6 to about 11.

According to another embodiment, the solvent 220 may contain a compound including an ester group. The light-emitting element 30 may be surrounded by aluminum oxide ($Al_2O_3$), which is the material of the insulating film 38 as described above with reference to FIGS. 4 and 5. That is to say, the insulating film 38 of the light-emitting element 30 may chemically bond with the solvent 220, and especially, the ester group contained in the solvent 220 has a large interaction energy with aluminum oxide. Accordingly, the light-emitting elements 30 can be evenly dispersed in the solvent 220.

According to an embodiment of the disclosure, the solvent 220 may include a compound represented by Chemical Formula 1 below:

[Chemical Formula 1]

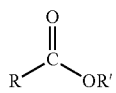

where R and R' may be each independently, hydrogen, a substituted or unsubstituted linear or branched alkyl group having 1 to 10 carbon atoms, a substituted or unsubstituted alkyl ether group having 1 to 10 carbon atoms, a substituted or unsubstituted alkyl ester group having 1 to 10 carbon atoms, or a substituted or unsubstituted phenyl group. The substituent may be at least one selected from the group consisting of an alkyl group having 1 to 10 carbon atoms, an ester group, an alkyl ester group having 1 to 10 carbon atoms, an ether group, an alkyl ether group having 1 to 10 carbon atoms, a carbonyl group and a hydroxy group. However, the disclosure is not limited thereto.

According to an embodiment of the disclosure, the solvent 220 may include a compound represented by one of Chemical formulas 2 to 9 below:

[Chemical Formula 2]

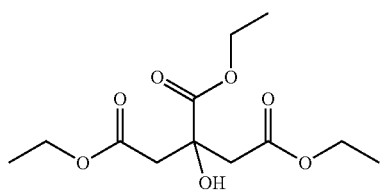

[Chemical Formula 3]

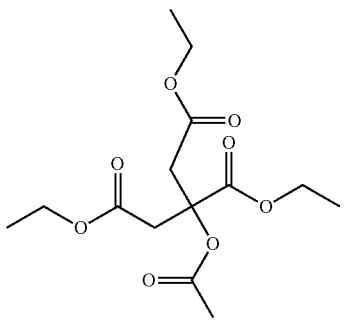

[Chemical Formula 4]

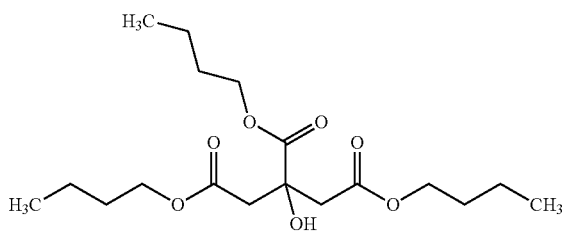

[Chemical Formula 5]

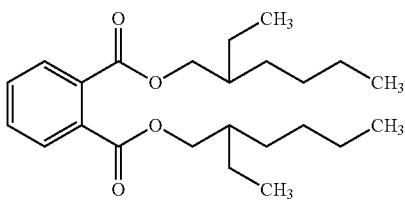

[Chemical Formula 6]

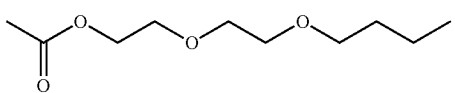

[Chemical Formula 7]

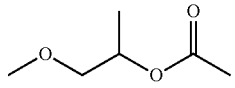

[Chemical Formula 8]

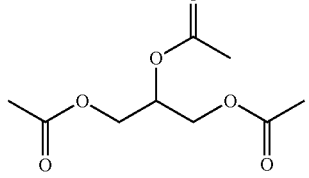

[Chemical Formula 9]

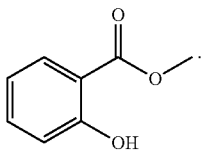

The compounds represented by Chemical Formulas 2 to 9 may include at least one ester group. Each of the compounds may include 1 to 4 ester groups to improve the dispersibility of the light-emitting elements 30 in the solvent 220.

According to an embodiment of the disclosure, triethyl citrate represented by Chemical Formula 2 has a large interaction energy with aluminum oxide ($Al_2O_3$) of approximately −3.54. Since triethyl citrate has a large interaction energy that can break the bond between the solvent 220 and the light-emitting elements 30, the dispersibility of the light-emitting elements 30 was increased, so that the light-emitting elements 30 hardly stuck together. On the other hand, triethylene glycol monobutyl ether has a small interaction energy with aluminum oxide ($Al_2O_3$), i.e., approximately −2.84, and thus many of the light-emitting elements 30 stuck together in the solvent 220 of triethylene glycol monobutyl ether.

In view of the above, the solvent 220 containing an ester group according to the embodiment can improve the dispersibility of the light-emitting elements 30 to thereby suppress the light-emitting elements 30 from sticking together.

According to yet another embodiment, a solvent 220 may contain an ester group and may also meet the Hansen solubility parameters of a polarity parameter between about 4 and about 9 and a hydrogen bonding parameter between of about 6 and about 11.

According to an embodiment, the compounds represented by Formulas 2 to 9 described above may contain an ester group and may meet the Hansen solubility parameters of a polarity parameter between about 4 and 9 and a hydrogen bonding parameter between about 6 and about 11.

For example, triethyl citrate represented by Chemical Formula 2 has the polarity parameter of about 6 and the hydrogen bonding parameter of about 10.1. Triethyl O-Acetyl citrate represented by Chemical Formula 3 has the polarity parameter of about 4.7 and the hydrogen bonding parameter of about 7.2. Tributyl citrate represented by Chemical Formula 4 has the polarity parameter of about 4.3 and the hydrogen bonding parameter of about 7.3. Diethylhexyl phthalate represented by Chemical Formula 5 has the polarity parameter of about 5.8 and the hydrogen bonding parameter of about 6.6. Butyl carbitol acetate represented by Chemical Formula 6 has the polarity parameter of about 4.8 and the hydrogen bonding parameter of about 6.5. Propylene glycol monomethyl ether acetate represented by Chemical Formula 7 has the polarity parameter of about 5.5 and the hydrogen bonding parameter of about 6.6. Triacetin represented by Chemical Formula 8 has the polarity parameter of about 5.8 and the hydrogen bonding parameter of about 8.7. Methyl salicylate represented by Formula 9 has the polarity parameter of about 8.7 and the hydrogen bonding parameter of about 10.2.

In case that the solvent 220 contains an ester group and meets the Hansen solubility parameters of a polarity parameter between about 4 and about 9 and a hydrogen bonding parameter between about 6 and about 11, it is possible to further improve the dispersibility of the light-emitting elements 30 in the solvent 220.

Incidentally, it is necessary to maintain the light-emitting elements 30 dispersed before or during the printing process. According to an embodiment of the disclosure, the solvent 220 may have a viscosity from about 20 cP to about 200 cP at room temperature. If the viscosity of the solvent 220 at room temperature is equal to or greater than about 20 cP, the light-emitting elements 30 can remain dispersed in the solvent 220. If the viscosity of the solvent 220 at room temperature is equal to or less than about 200 cP, it may be easily ejected onto the substrate via the printing process.

After the printing process of the light-emitting elements 30, it is necessary to remove the solvent 220 by volatilizing it. The solvent 220 may have a relatively high boiling point and may be adjusted so that the boiling point is not too high. According to an embodiment of the disclosure, the solvent 220 has the boiling point of about 400° C. or less, so that features formed on the substrate are not damaged by high heat.

The content of the light-emitting elements 30 included in the ink 200 may vary depending on the number of light-emitting elements 30 per droplet of the ink 200 discharged through a nozzle during a printing process. According to an embodiment of the disclosure, the light-emitting elements 30 may be included in the solvent from about 0.01 to about 10 parts by weight based on 100 parts by weight of the ink 200. It is, however, to be noted that this is merely illustrative, and the content of the light-emitting elements 30 may vary depending on the number of light-emitting elements 30 per droplet of the ink 200.

The ink 200 may further include a dispersant (not shown) that improves the degree of dispersion of the light-emitting elements 30. The type of the dispersant is not particularly limited herein. The content of the dispersant may be determined appropriately to further disperse the light-emitting elements 30. For example, the dispersant may be included from about 10 to about 50 parts by weight based on 100 parts by weight of the light-emitting elements 30. It is, however, to be understood that the disclosure is not limited thereto.

The ink 200 according to the embodiment of the disclosure includes the solvent 220 that meets the polarity parameter and the hydrogen bonding parameter in the predetermined ranges and includes at least one ester group, thereby improving dispersibility of the light-emitting elements 30. By doing so, it is possible to prevent the light-emitting elements 30 from sticking together before and during the printing process. Accordingly, it is possible to prevent poor alignment which occurs as the light-emitting elements 30 dispersed on the electrodes 21 and 22 stick together.

During the process of fabricating the display device 10, a process of disposing the light-emitting elements 30 on the electrodes 21 and 22 may be carried out, which may be carried out via the printing process using the ink 200.

Hereinafter, an inkjet printing apparatus for ejecting the ink 200 containing light-emitting elements will be described.

Figure 12:
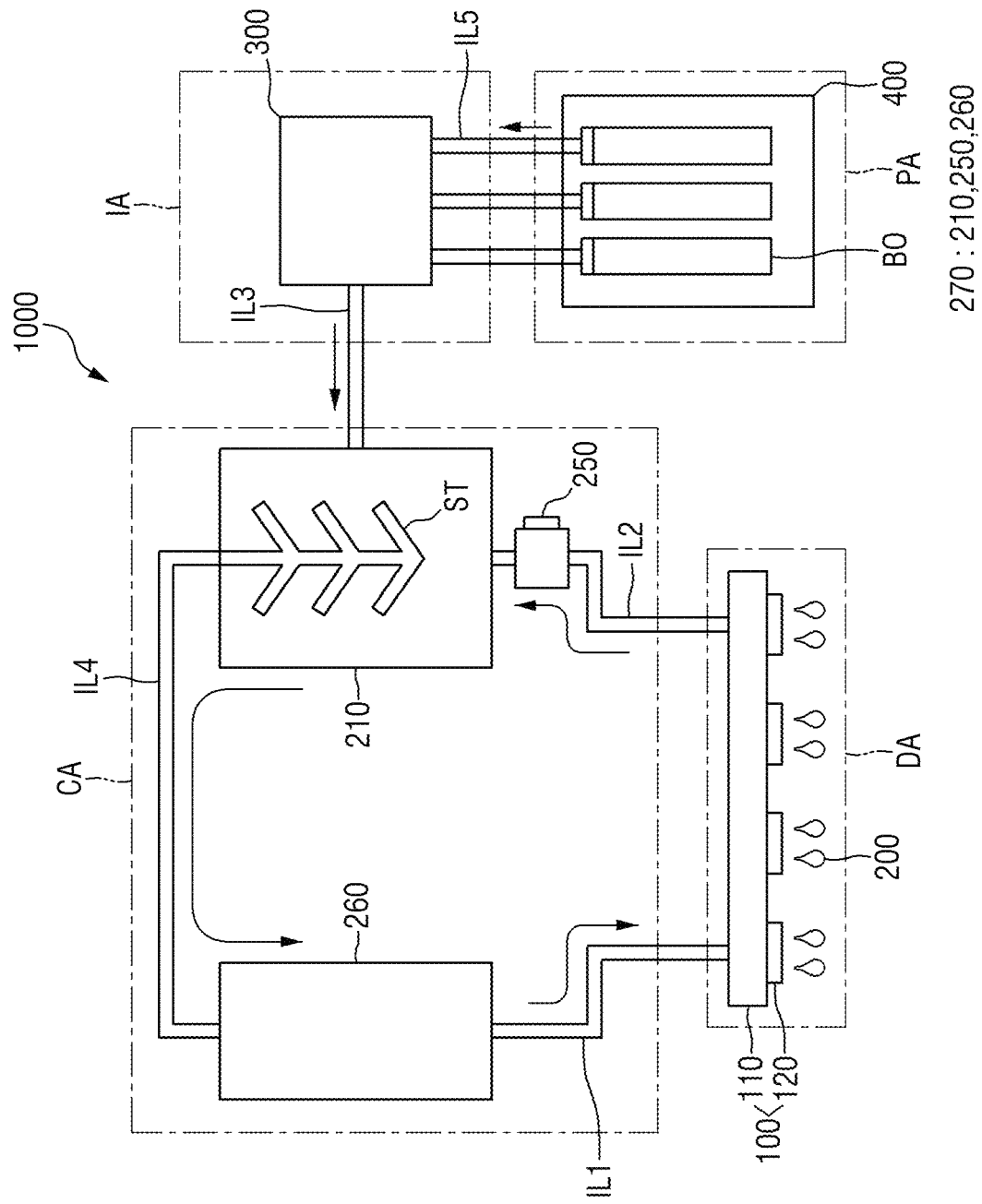
FIG. 12 is a diagram schematically showing an inkjet printing apparatus according to an embodiment of the disclosure.

FIG. 12 is a diagram schematically showing an inkjet printing apparatus according to an embodiment of the disclosure.

Referring to FIG. 12, the inkjet printing apparatus 1000 may include a discharge area DA, a circulation area CA, an injection area IA, and a preparation area PA.

In the discharge area DA, droplets of the ink 200 may be discharged. A print head unit 100 may be disposed in the discharge area DA and may include a body 110 and a nozzle of inkjet heads 120. The print head unit 100 may be disposed in the discharge area DA to discharge the ink 200 containing light-emitting elements through the nozzle of inkjet heads 120.

In the circulation area CA, the ink 200 to be provided to the print head unit 100 circulates. By circulating the ink 200 containing the light-emitting elements in the circulation area CA, it is possible to reduce deviations in the number of light-emitting elements 30 contained in the ink 200.

The circulation area CA may include an ink circulation unit 270. The ink circulation unit 270 may supply the ink 200 containing the light-emitting elements to the print head unit 100 or may receive the ink 200 to circulate it.

The ink circulation unit 270 may be connected to the print head unit 100 through first and second connection pipes IL1 and IL2. Specifically, the ink circulation unit 270 may supply the ink 200 to the print head unit 100 through the first injection line IL1 and may receive the ink 200 from the print head unit 100 through the second injection line IL2.

The ink circulation unit 270 may include a first ink storage 260, a second ink storage 210, and a pressure pump 250. The first ink storage 260 may be connected to the print head unit 100 through the first injection line IL1. The first ink storage 260 may be connected to the second ink storage 210 through a fourth injection line IL4. The second ink storage 210 may be connected to the print head unit 100 through the second injection line IL2. The pressure pump 250 may be disposed between the second ink storage 210 and the print head unit 100. They may form a single ink circulation system.

The first ink storage 260 may temporarily store or accommodate the ink 200 before the ink 200 is supplied to the print head unit 100 and may deliver the ink 200 to the print head unit 100. The first ink storage 260 may deliver the ink 200 supplied from the second ink storage 210 through the fourth injection line IL4 to the print head unit 100 through the first injection line IL1.

The second ink storage 210 may store and/or accommodate the ink 200 before the ink 200 is supplied to the first ink storage 260 and may disperse the light-emitting elements 30 in the solvent 220. The second ink storage 210 may receive the ink 200 from the ink injecting unit 300 through a third injection line IL3 and the ink 200 from the print head unit 100 through the second injection line IL2 and may disperse the light-emitting elements 30 in the ink 200 so that they do not precipitate. As a result, the ink 200 having uniform degree of dispersion can be supplied to the first ink storage 260. The second ink storage 210 may work as a buffer storage in which a part of the ink 200 circulated in the ink circulation system is stored.

The second ink storage 210 may include a stirrer ST. The stirrer ST can disperse the light-emitting elements 30 in the ink 200. As the stirrer ST rotates, the light-emitting elements 30 in the ink 200 supplied to the second ink storage 210 can remain dispersed without sinking. Specifically, the stirrer ST of the second ink storage 210 can prevent different numbers of the light-emitting elements 30 in the ink 200 from being discharged through the inkjet heads 120 at different processing timings as the light-emitting elements 30 sink to the bottom.

The pressure pump 250 may be disposed between the print head unit 100 and the second ink storage 210. The remaining part of the ink 200 after it is ejected from the print head unit 100 may be supplied to the second ink storage 210 through the pressure pump 250. The pressure pump 250 may transfer power to a fluid so that the ink 200 can circulate in the ink circulation system.

The injection area IA may receive the ink 200 from ink bottles BO provided in the inkjet printing apparatus 1000 to supply it to the circulation area CA. The injection area IA may include the ink injecting unit 300. The ink injecting unit 300 converts the ink 200 stored in the ink bottle BO with a high viscosity into the ink 200 with a low viscosity and supplies it to the ink circulation unit 270. For example, in case that the ink bottles BO are provided in the inkjet printing apparatus 1000, the ink injecting unit 300 may convert the ink 200 into a solid or a liquid or colloidal ink 200 with a high viscosity into a liquid or colloidal ink 200 with a low viscosity and may supply it to the ink circulation unit 270. The ink injecting unit 300 may deliver the ink 200 supplied from an ink preparing unit 400 through a fifth injection line IL5 to the ink circulation unit 270, e.g., the ink storage 210 through the third injection line IL3.

In preparation area PA, one or more ink bottles BO may be stored before or during the printing process. The preparation area PA may store the ink bottle BO under certain conditions so that precipitation or sedimentation of the light-emitting elements 30 does not occur in order to improve the reliability of the printing process.

The preparation area PA may include the ink preparing unit 400. The ink preparing unit 400 may provide the ink bottles BO in which the previously produced ink 200 is stored to the printing apparatus 1000 or may store the ink bottles BO. The ink preparing unit 400 may supply the ink 200 stored in the ink bottles BO to the ink injecting unit 300 through the fifth injection line IL5.

A method of fabricating the display device 10 including the process of ejecting the ink 200 using the above-described inkjet printing apparatus according to an embodiment of the disclosure will be described below.

Figure 13:
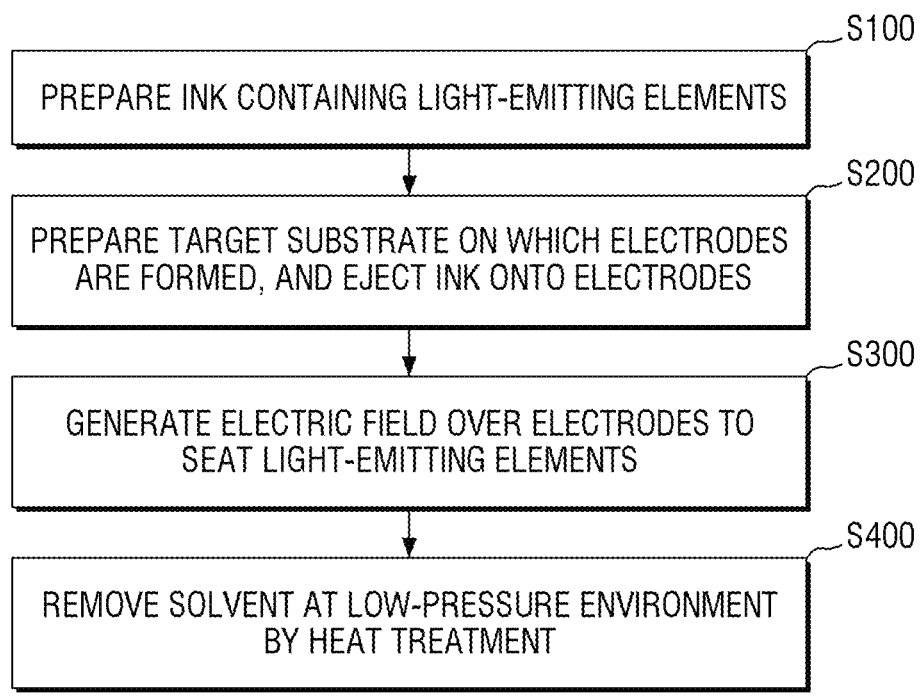
FIG. 13 is a flowchart for illustrating a method of fabricating a display device according to an embodiment of the disclosure.

FIG. 13 is a schematic flowchart for illustrating a method of fabricating a display device according to an embodiment of the disclosure.

Referring to FIG. 13, a method of fabricating the display device 10 according to an embodiment may include preparing an ink 200 including light-emitting elements 30 and a solvent 200 and a target substrate SUB on which electrodes 21 and 22 are formed (step S100), ejecting droplets of the ink 200 onto the target substrate SUB (step S200), and generating an electric field over the electrodes 21 and 22 so that the light-emitting elements 30 seat on the electrodes 21 and 22 (step S300). According to an embodiment of the disclosure, the solvent 220 has the Hansen solubility parameters of a polarity parameter between about 4 to about 9 and a hydrogen bonding parameter between about 6 and about 11, and includes at least one ester group, thereby improving the dispersibility of the light-emitting elements 30. Hereinafter, a method of fabricating the display device 10 will be described in detail with reference to other drawings.

FIGS. 14 to 21 are schematic cross-sectional views showing some of processing steps of fabricating a display device according to an embodiment of the disclosure.

Figure 14:
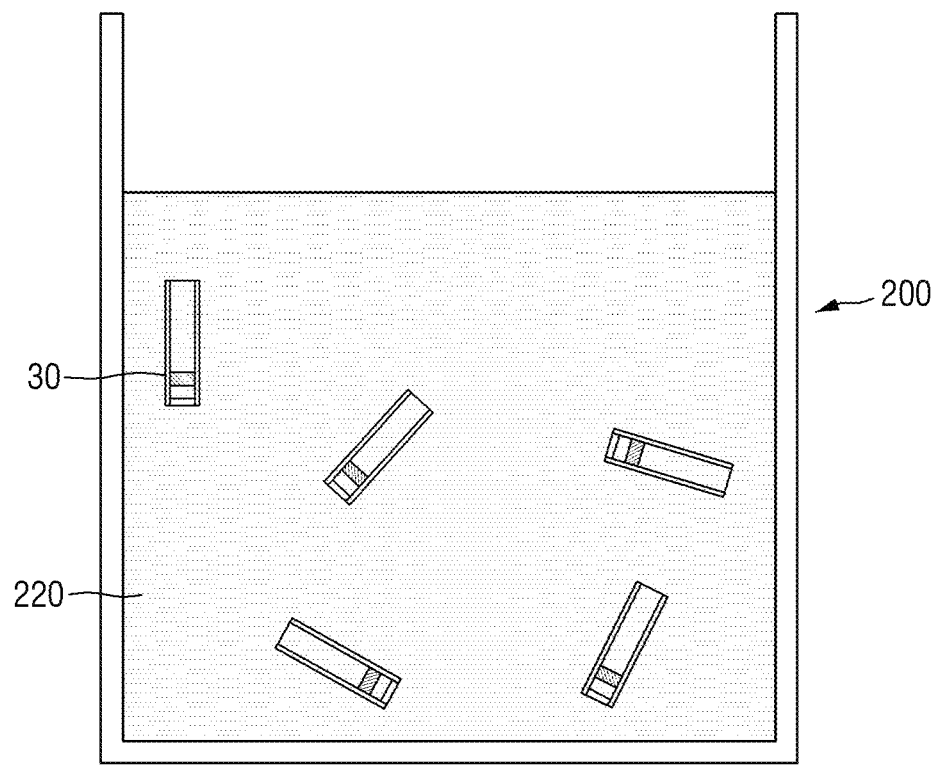
FIGS. 14 to 21 are schematic cross-sectional views showing some of processing steps of fabricating a display device according to an embodiment of the disclosure.
Figure 15:
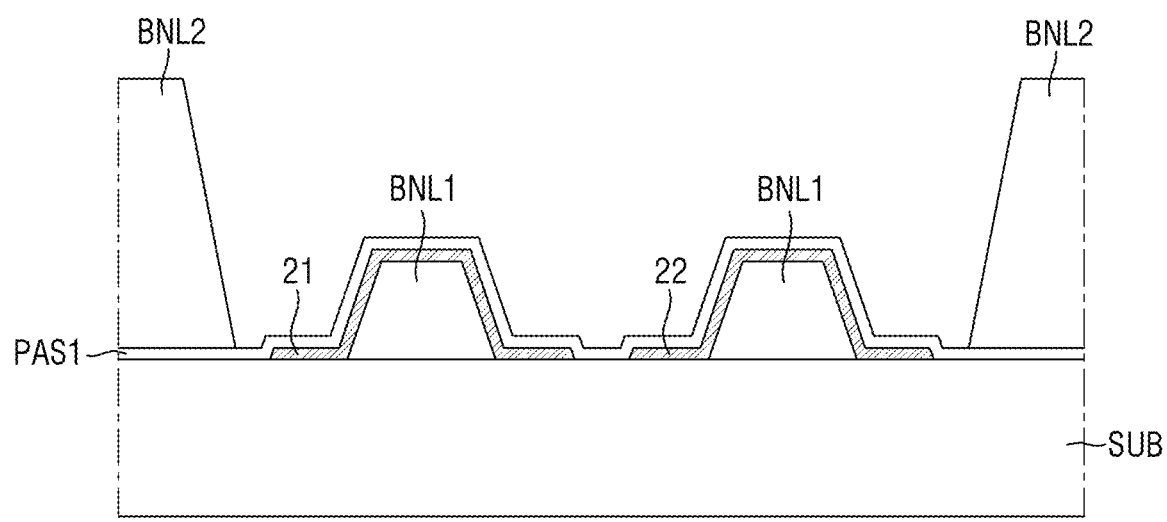

Initially, referring to FIGS. 14 and 15, the ink 200 including light-emitting elements 30 and a solvent 220, and the target substrate SUB on which a first electrode 21, a second electrode 22, a first passivation layer PAS1 and a first bank BNL1 are disposed are prepared. Although a pair of electrodes is disposed on the target substrate SUB in the drawing, a larger number of electrode pairs may be disposed on the target substrate SUB. The target substrate SUB may include circuit elements disposed thereon in addition to the first substrate 11 of the display device 10 described above. In the following description, the circuit elements will be omitted for convenience of illustration.

The ink 200 may include the solvent 220 and the light-emitting elements 30 dispersed therein. The solvent 220 may have the Hansen solubility parameters of a polarity parameter between about 4 and about 9 and a hydrogen bonding parameter between about 6 and about 11, and/or may include at least one ester group. The preparing the ink 200 may include a dispersion process of mixing the light-emitting elements 30 with the solvent 220.

The dispersion process is performed by mixing the light-emitting elements 30 in the solvent 220 and mixing it for five minutes or more. The light-emitting elements 30 may be included in the solvent from about 0.01 to about 10 parts by weight based on 100 parts by weight of the total ink 200. The mixing process may be performed by a sonication process, a stirring process, a milling process, etc.

The ink 200 produced by the dispersion process may be stored at the room temperature (25° C.). The solvent 220 may have the Hansen solubility parameters of a polarity parameter between about 4 and about 9 and a hydrogen bonding parameter between about 6 and about 11, and/or may include at least one ester group. Accordingly, it is possible to improve the dispersibility of the mixed light-emitting elements 30 to prevent them from sticking together, so that they hardly precipitate and can remain dispersed.

Figure 16:
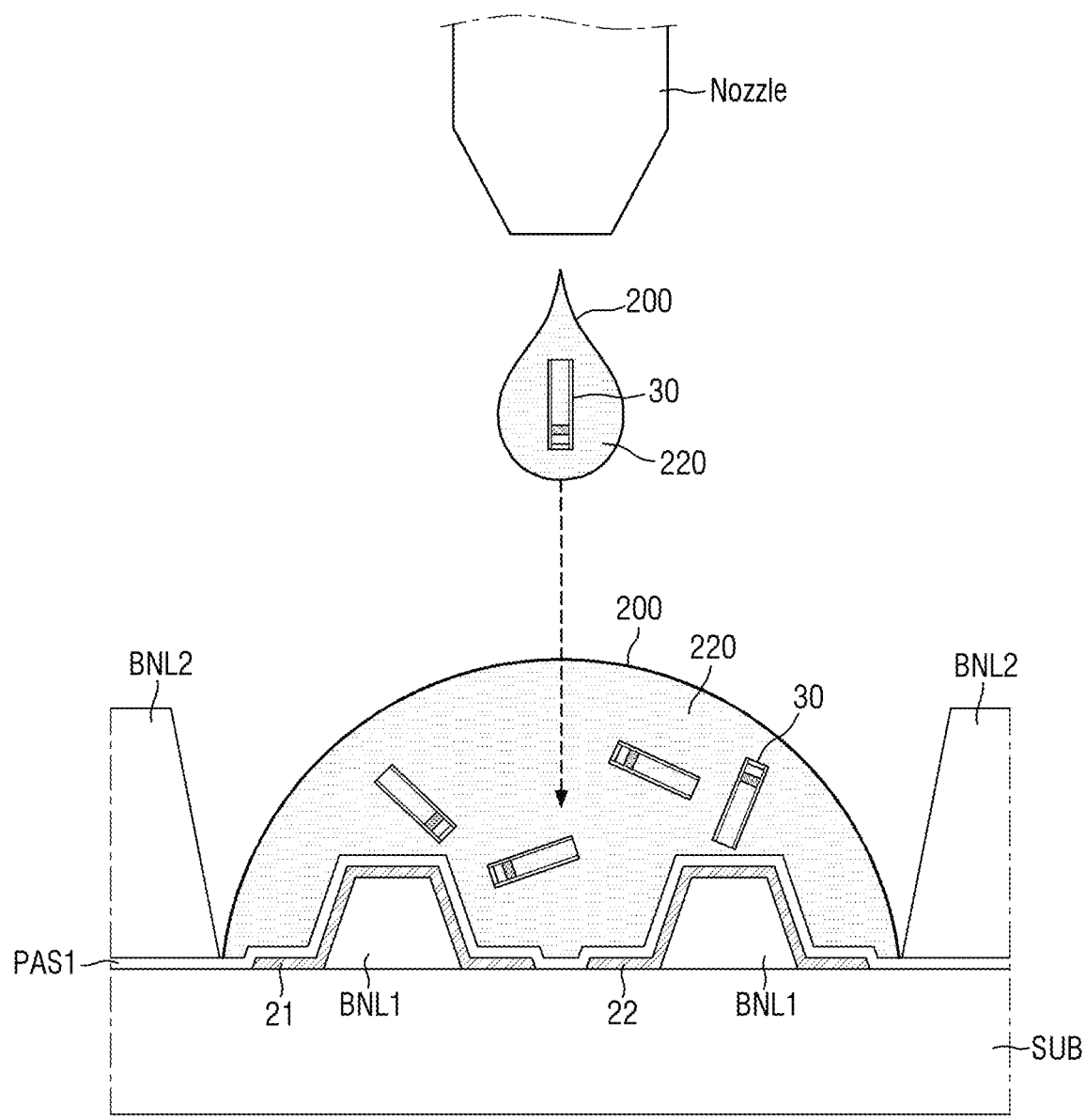
Figure 17:
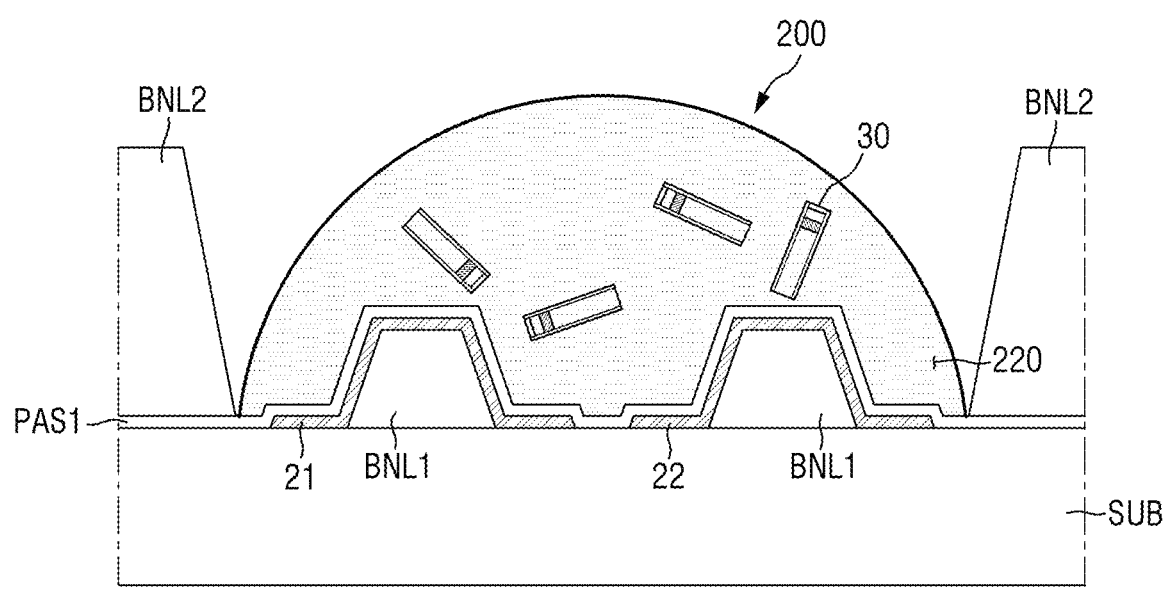

Subsequently, referring to FIGS. 16 and 17, droplets of the ink 200 are ejected onto the first passivation layer PAS1 overlapping the first electrode 21 and the second electrode 22 on the target substrate SUB. According to an embodiment of the disclosure, droplets of the ink 200 may be ejected onto the first passivation layer PAS1 by the printing process using the inkjet printing apparatus described above. The droplets of the ink 200 may be ejected through a nozzle of an inkjet heads included in the inkjet printing apparatus. The droplets of the ink 200 may be discharged onto the target substrate SUB through the nozzle provided in the inkjet heads. The droplets of the ink 200 discharged from the nozzle may be disposed on the first passivation layer PAS1 on which the electrodes 21 and 22 disposed on the target substrate SUB are formed. The light-emitting elements 30 may have a shape extending in a direction and may be dispersed in the ink 200 with the direction randomly orientated.

When the light-emitting elements 200 are ejected onto the first passivation layer PAS1, the ink 200 may evenly spread in the second bank BNL2. Accordingly, the light-emitting elements 30 dispersed in the ink 200 may be evenly distributed in the second bank BNL2.

Subsequently, an electric field is generated in the ink 200 to dispose the light-emitting elements 30 on the electrodes 21 and 22 (step S300), and the solvent 220 is removed (step S400).

Figure 18:
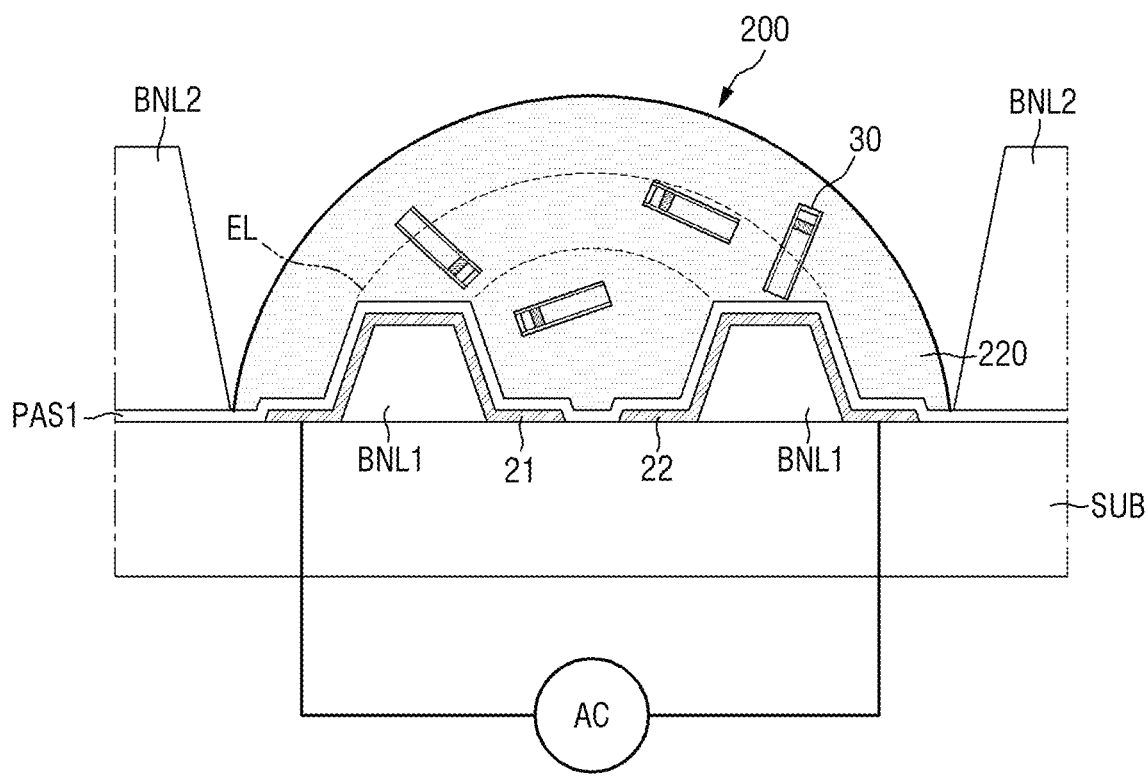

Referring to FIG. 18, after the droplets of the ink 200 including the light-emitting elements 30 are ejected onto the target substrate SUB, an alignment signal is applied to the electrodes 21 and 22 to generate an electric field EL over the target substrate SUB. The light-emitting elements 30 dispersed in the solvent 220 may receive a dielectrophoretic force by the electric field EL and may be disposed on the electrodes 21 and 22 with their orientations and locations changed.

When the electric field EL is generated over the target substrate SUB, the light-emitting elements 30 may receive the dielectrophoretic force. When the electric field EL generated over the target substrate SUB is parallel to the upper surface of the target substrate, the light-emitting elements 30 may be aligned such that the direction in which they extend is parallel to the target substrate and may be disposed on the first electrode 21 and the electrode 22. The light-emitting elements 30 may move toward the electrodes 21 and 22 from the initially dispersed locations by the dielectrophoretic force. Both ends of each of the light-emitting elements 30 may be disposed on the first electrode 21 and the second electrode 22, respectively, while their orientations may be changed by the electric field EL. Each of the light-emitting elements 30 includes semiconductor layers doped with different conductivity types and may have a dipole moment within therein. The light-emitting elements 30 having the dipole moment may receive the dielectrophoretic force so that both ends are disposed on the electrodes 21 and 22, respectively, in case that they are placed under the electric field EL.

The "alignment degree" of the light-emitting elements 30 may mean deviations in the orientations and the locations of the light-emitting elements 30 aligned on the target substrate SUB. For example, if there are large deviations in the orientations and the locations of the light-emitting elements 30, the alignment degree of the light-emitting elements 30 is low. If there are small deviations in the orientations and the locations of the light-emitting elements 30, the alignment degree of the light-emitting elements 30 is high or improved.

During the process of fabricating the display device 10, after the light-emitting elements 30 have been disposed between the electrodes 21 and 22, the process of removing the solvent 220 by irradiating heat to the ink 200 may be carried out.

Figure 19:
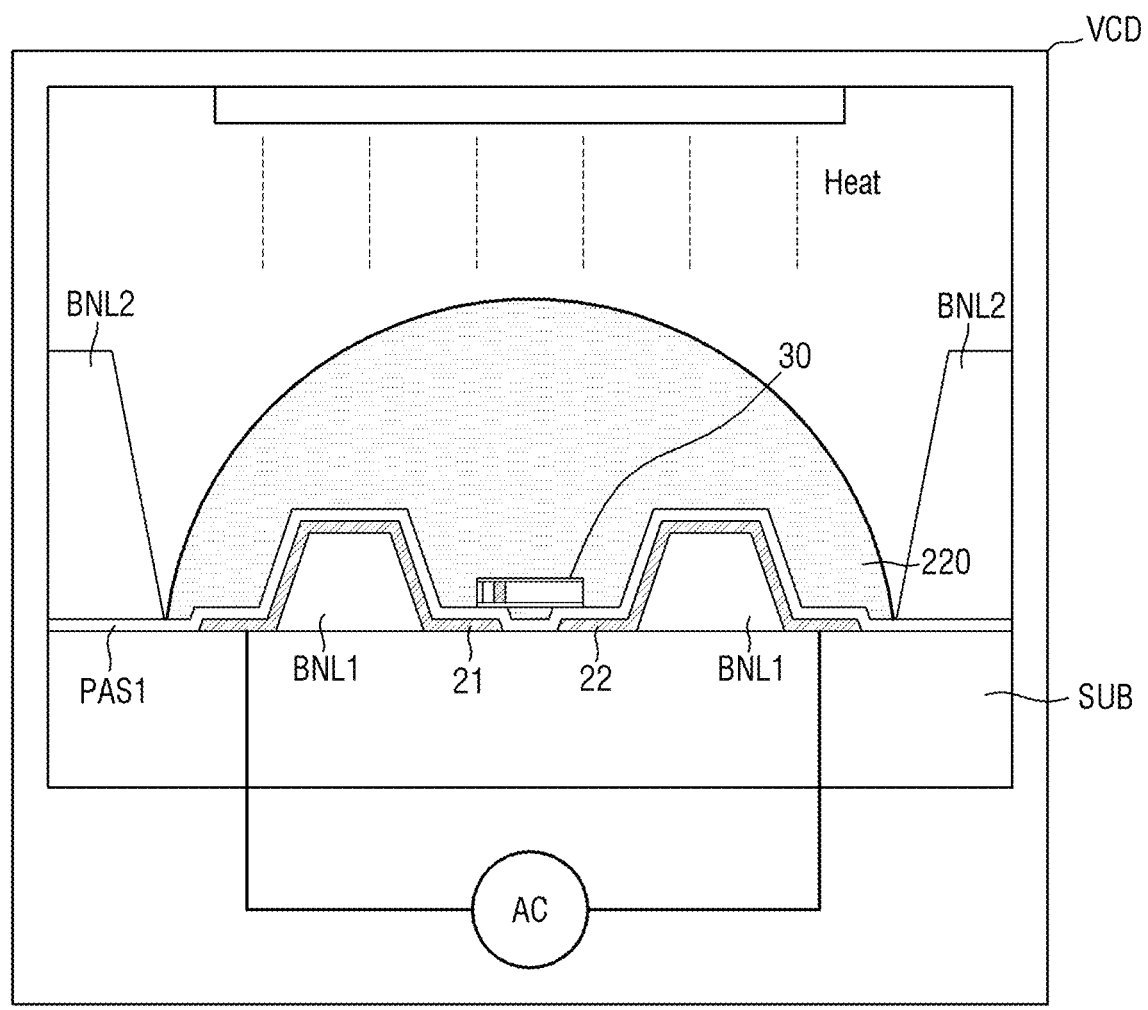
Figure 20:
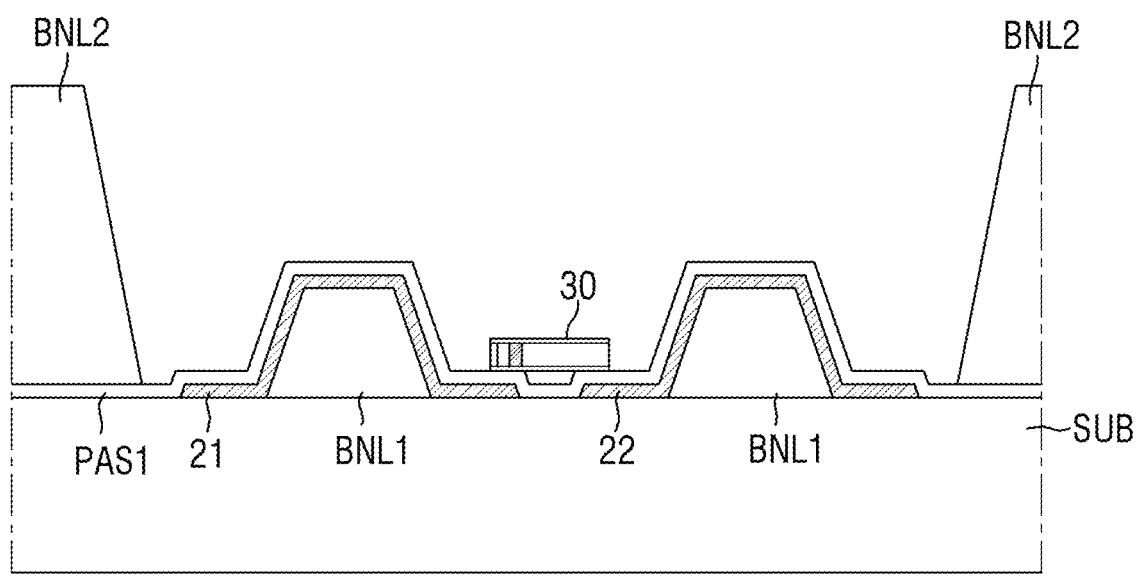

Referring to FIGS. 19 and 20, the process of removing the solvent 220 may be carried out in a chamber VCD of which internal pressure is adjustable. The chamber VCD may adjust the internal pressure therein and may remove the solvent 220 by irradiating heat on the target substrate SUB with the pressure adjusted.

According to the method of fabricating the display device 10, it is possible to completely remove the solvent 220 by a heat treatment at a low-pressure environment. According to an embodiment of the disclosure, the process of removing the solvent 220 may be carried out under a pressure in a range of about $10^{-4}$ Torr to about 1 Torr at a temperature in a range of about 100° C. to about 400° C. In case that a heat treatment process is carried out under the above pressure ranges, the boiling point of the solvent 220 is also lowered, so that it can be more easily removed. The heat treatment process in the chamber VCD may be carried out for about 1 minute to about 30 minutes. It is, however, to be understood that the disclosure is not limited thereto.

Figure 21:
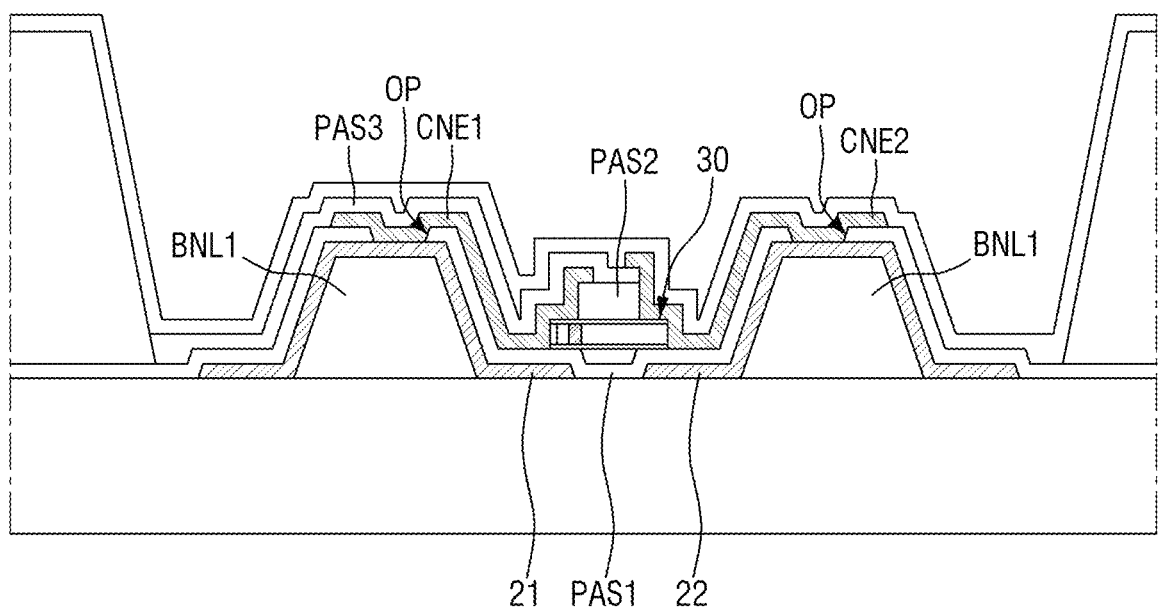

Subsequently, referring to FIG. 21, insulating layers PAS1, PAS2, PAS3 and PAS4, and contact electrodes CNE1 and CNE2 may be formed on the light-emitting elements 30 and the electrodes 21 and 22. By performing the above-described processes, the display device 10 including the light-emitting elements 30 can be fabricated.

The display device 10 according to the embodiment can be fabricated by using the ink 200 including the solvent 220. The solvent 220 may include an ester group and/or may have a polarity parameter and a hydrogen bonding parameter in a specific range of Hansen solubility parameters, thereby increasing dispersibility of the light-emitting elements 30. Accordingly, it is possible to suppress the light-emitting elements 30 from sticking together in dropping droplets of the ink 200 containing the light-emitting elements 30 onto sub-pixels, thereby preventing poor alignment and achieving uniform luminance in the sub-pixels. In this manner, a uniform number of light-emitting elements 30 can be arranged per unit area of the display device 10 with a high alignment degree, and the reliability of the display device 10 can be improved.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:
1. An ink, comprising:
   a solvent; and
   a plurality of light-emitting elements dispersed in the solvent, wherein
   each of the plurality of light-emitting elements comprises:
     a first semiconductor layer;
     a second semiconductor layer;
     a light-emitting layer disposed between the first semiconductor layer and the second semiconductor layer; and
     an insulating film surrounding at least an outer surface of the light-emitting layer, and the solvent has Hansen solubility parameters of a polarity parameter between about 4 and about 9 and a hydrogen bonding parameter between about 6 and about 11.

2. The ink of claim 1, wherein the solvent comprises at least one ester group.

3. The ink of claim 2, wherein the solvent comprises a compound represented by Chemical Formula 1 below:

[Chemical Formula 1]

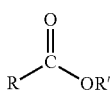

wherein each of R and R' is hydrogen, a substituted or unsubstituted linear or branched alkyl group having 1 to 10 carbon atoms, a substituted or unsubstituted alkyl ether group having 1 to 10 carbon atoms, a substituted or unsubstituted alkyl ester group having 1 to 10 carbon atoms, or a substituted or unsubstituted phenyl group.

4. The ink of claim 3, wherein a substituent of each of the R and R' is at least one selected from a group consisting of an alkyl group having 1 to 10 carbon atoms, an ester group, an alkyl ester group having 1 to 10 carbon atoms, an ether group, an alkyl ether group having 1 to 10 carbon atoms, a carbonyl group, and a hydroxy group.

5. The ink of claim 4, wherein the solvent comprises a compound represented by one of Chemical Formulas 2 to 9 below:

[Chemical Formula 2]

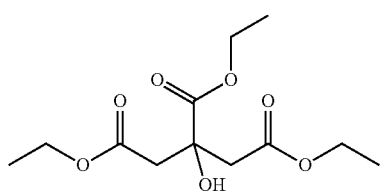

[Chemical Formula 3]

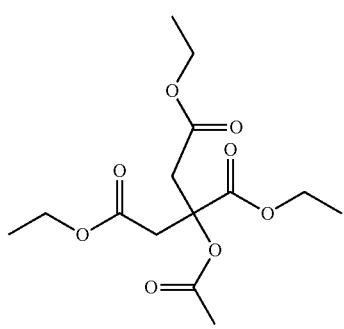

[Chemical Formula 4]

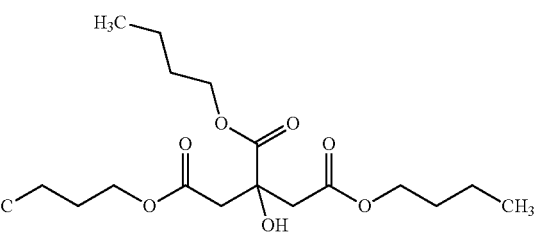

[Chemical Formula 5]

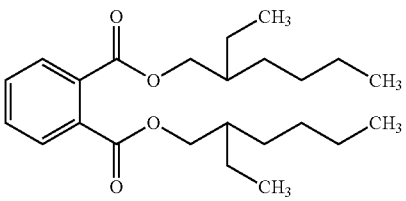

[Chemical Formula 6]

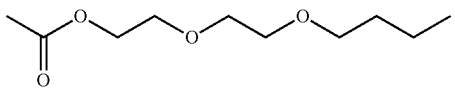

[Chemical Formula 7]

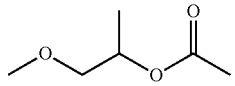

[Chemical Formula 8]

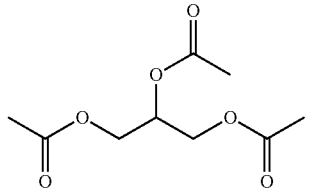

[Chemical Formula 9]

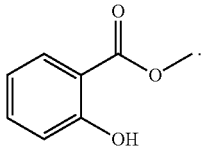

6. The ink of claim 4, wherein the solvent has a viscosity in a range of about 20 cP to about 200 cP at a room temperature.

7. The ink of claim 4, wherein a boiling point of the solvent is equal to or less than about 400° C.

8. The ink of claim 4, wherein a content of the plurality of light-emitting elements is about 0.01 to about 10 parts by weight based on 100 parts by weight of the ink.

9. The ink of claim 2, wherein the solvent comprises 1 to 4 ester groups.

10. A method of fabricating a display device, the method comprising:
preparing an ink comprising a solvent and a plurality of light-emitting elements;
preparing a target substrate on which a first electrode and a second electrode are formed;
applying the ink onto the target substrate; and
generating an electric field over the target substrate to dispose the plurality of light-emitting elements on the first electrode and the second electrode,
wherein the solvent has Hansen solubility parameters of a polarity parameter between about 4 and about 9 and a hydrogen bonding parameter between about 6 and about 11.

11. The method of claim 10, wherein the solvent comprises at least one ester group.

12. The method of claim 11, wherein the solvent comprises 1 to 4 ester groups.

13. The method of claim 10, wherein the solvent comprises a compound represented by Chemical Formula 1 below:

[Chemical Formula 1]

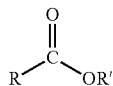

wherein each of R and R' is hydrogen, a substituted or unsubstituted linear or branched alkyl group having 1 to 10 carbon atoms, a substituted or unsubstituted alkyl ether group having 1 to 10 carbon atoms, a substituted or unsubstituted alkyl ester group having 1 to 10 carbon atoms, or a substituted or unsubstituted phenyl group.

14. The method of claim 13, wherein a substituent of each of the R and R' is at least one selected from a group consisting of an alkyl group having 1 to 10 carbon atoms, an ester group, an alkyl ester group having 1 to 10 carbon atoms, an ether group, an alkyl ether group having 1 to 10 carbon atoms, a carbonyl group, and a hydroxy group.

15. The method of claim 14, wherein the solvent comprises a compound represented by one of Chemical Formulas 2 to 9 below:

[Chemical Formula 2]

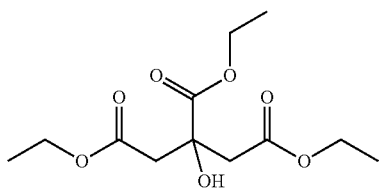

[Chemical Formula 3]

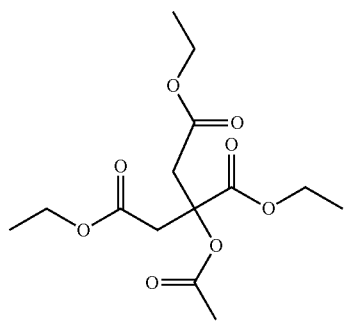

[Chemical Formula 4]

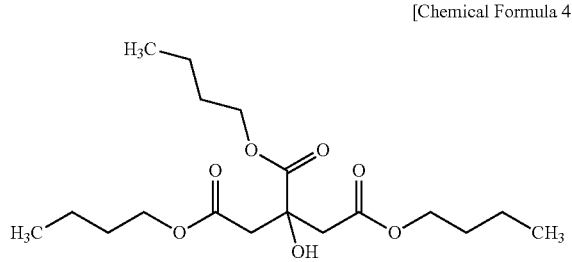

[Chemical Formula 5]

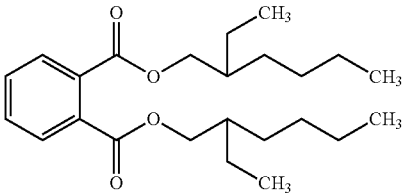

[Chemical Formula 6]

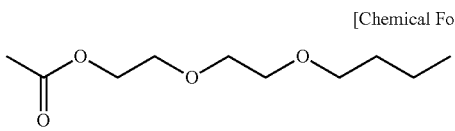

[Chemical Formula 7]

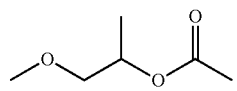

[Chemical Formula 8]

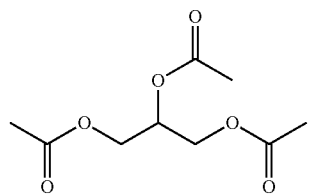

[Chemical Formula 9]

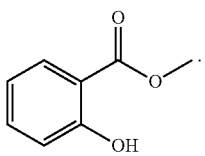

16. The method of claim 13, wherein the solvent has a viscosity in a range of about 20 cP to about 200 cP at a room temperature.

17. The method of claim 13, wherein a boiling point of the solvent is equal to or less than about 400° C.

18. The method of claim 10, further comprising:
performing a heat treatment to remove the solvent after the generating of the electric field over the target substrate to dispose the plurality of light-emitting elements on the first electrode and the second electrode.

19. The method of claim 18, wherein the heat treatment is performed at a temperature in a range of about 100° C. to about 400° C.

* * * * *